(12) United States Patent
Peng et al.

(10) Patent No.: US 11,271,150 B2
(45) Date of Patent: Mar. 8, 2022

(54) INTEGRATED CIRCUIT

(71) Applicant: TAIWAN SEMICONDUCTOR MANUFACTURING CO., LTD., Hsinchu (TW)

(72) Inventors: Tai-Yen Peng, Hsinchu (TW); Chien-Chung Huang, Taichung (TW); Yu-Shu Chen, Hsinchu (TW); Sin-Yi Yang, Taichung (TW); Chen-Jung Wang, Hsinchu (TW); Han-Ting Lin, Hsinchu (TW); Chih-Yuan Ting, Taipei (TW); Jyu-Horng Shieh, Hsinchu (TW); Hui-Hsien Wei, Taoyuan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 36 days.

(21) Appl. No.: 16/866,114

(22) Filed: May 4, 2020

(65) Prior Publication Data
US 2020/0266340 A1 Aug. 20, 2020

Related U.S. Application Data

(62) Division of application No. 16/194,124, filed on Nov. 16, 2018, now Pat. No. 10,651,373.

(60) Provisional application No. 62/737,928, filed on Sep. 28, 2018.

(51) Int. Cl.
*H01L 27/22* (2006.01)
*H01L 43/12* (2006.01)
*H01L 43/02* (2006.01)

(52) U.S. Cl.
CPC ............ *H01L 43/12* (2013.01); *H01L 27/224* (2013.01); *H01L 27/228* (2013.01); *H01L 27/222* (2013.01); *H01L 43/02* (2013.01)

(58) Field of Classification Search
None
See application file for complete search history.

(56) References Cited

U.S. PATENT DOCUMENTS

| 10,121,827 | B1 | 11/2018 | Lin | |
|---|---|---|---|---|
| 2011/0156201 | A1 | 6/2011 | Chen | |
| 2019/0229261 | A1* | 7/2019 | Hsieh | H01L 27/222 |
| 2019/0326509 | A1* | 10/2019 | Yi | H01L 27/222 |
| 2020/0035906 | A1* | 1/2020 | Shum | H01L 27/222 |

* cited by examiner

*Primary Examiner* — Jae Lee
(74) *Attorney, Agent, or Firm* — Maschoff Brennan

(57) ABSTRACT

An integrated circuit is provided. The integrated circuit includes a metallization pattern, a dielectric layer, and plural memory devices. The metallization pattern has plural first conductive features and a second conductive feature. The dielectric layer is over the metallization pattern, in which the dielectric layer has a first portion over the first conductive features and a second portion over the second conductive feature. The memory devices are at least partially in the first portion of the dielectric layer and respectively connected with the first conductive features. The first portion of the dielectric layer has a plurality of side parts respectively surrounding the memory devices and an extending part connecting the side parts to each other, and a thickness of the second portion is greater than a thickness of the extending part of the first portion of the dielectric layer.

20 Claims, 39 Drawing Sheets

INTEGRATED CIRCUIT

PRIORITY CLAIM AND CROSS-REFERENCE

This application is a divisional application of U.S. patent application Ser. No. 16/194,124, filed Nov. 16, 2018, now U.S. Pat. No. 10,651,373, issued May 12, 2020, which claims priority to U.S. Provisional Application Ser. No. 62/737,928, filed Sep. 28, 2018, the entirety of which is incorporated by reference herein in their entireties.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
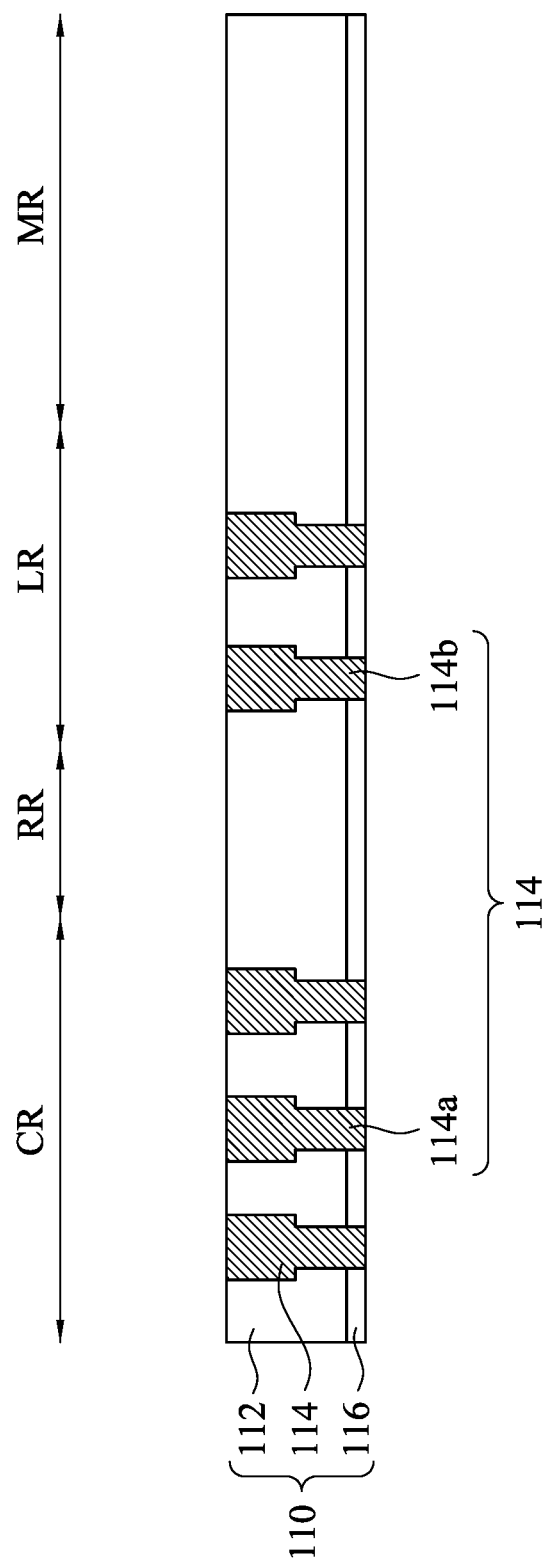
FIGS. 1A-1K are cross-sectional views of an integrated circuit at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The MTJ stack includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the MTJ stack is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ stack is in a lower resistive state, corresponding to a digital signal "0". When the magnetic moment of the ferromagnetic free layer is anti-parallel to that of the ferromagnetic pinned layer, the resistance of the MTJ stack is in a higher resistive state, corresponding to a digital signal "1". The MTJ stack is coupled between top and bottom electrode and an electric current flowing through the MTJ stack (tunneling through the tunnel barrier layer) from one electrode to the other is detected to determine the resistance and the digital signal state of the MTJ stack.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIGS. 1A-1K are cross-sectional views of an integrated circuit at various intermediate stages of manufacture according to various embodiments of the present disclosure. The illustration is merely exemplary and is not intended to be limiting beyond what is specifically recited in the claims that follow. It is understood that additional operations may be provided before, during, and after the operations shown by FIGS. 1A-1I, and some of the operations described below can be replaced or eliminated for additional embodiments of the method. The order of the operations/processes may be interchangeable.

FIG. 1A illustrates a semiconductor substrate having transistors and one or more metal/dielectric layers 110 over the transistors. The semiconductor substrate has a cell region CR where memory devices are to be formed, a logic region LR where logic circuits are to be formed, a peripheral region RR between the logic region LR and the cell region CR, and a mark region MR where alignment or overlay marks are to be formed.

The metal/dielectric layers 110 includes an interlayer dielectric (ILD) layer or inter-metal dielectric (IMD) layer 112 with a metallization pattern 114 over the logic region LR and the cell region CR. For example, the metallization pattern 114 includes plural conductive features 114a and 114b in the logic region LR and the cell region CR, respectively. The ILD layer 112 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 114 may be aluminum, aluminum alloy, copper, copper alloy, titanium, titanium nitride, tantalum, tantalum nitride, tungsten, cobalt, the like, and/or combinations thereof. Formation of the metallization pattern 114 and the ILD layer 112 may be a dual-damascene process and/or a single-damascene process. In some embodiments, the peripheral region RR is free of the metallization pattern 114. In some embodiments, the metal/dielectric layers 110 may further include an etch stop layer 116 underlying the ILD layer 112, in which the etch stop layer 116 has a different material than the ILD layer 112 and may stop an etching process during forming the metallization pattern 114. The substrate may also include active and passive devices, for example, underlying the etch stop layer 116. These further components are omitted from the figures for clarity.

Figure 1B:
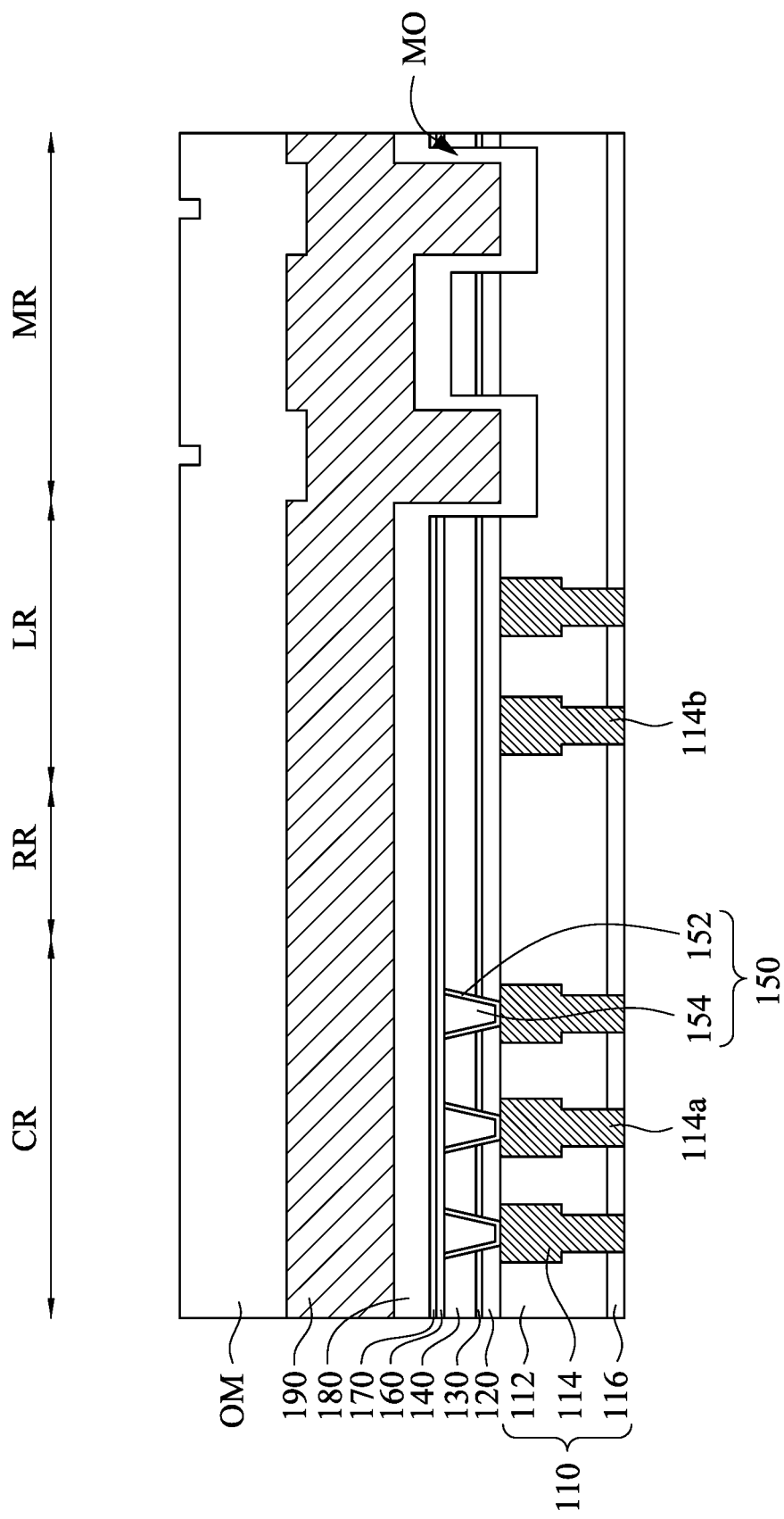

Referring to FIG. 1B, an etch stop layer 120, a protective layer 130, and a dielectric layer 140 are formed over the logic region LR, the peripheral region RR, the cell region CR, and the mark region MR on the metal/dielectric layers 110 in a sequence. The etch stop layer 120 may have a high etch resistance to one or more subsequent etching processes. The etch stop layer 120 may be formed of dielectric material different from the underlying ILD layer 112. For example, the ILD layer 112 may be a silicon oxide layer, and the etch stop layer 120 may be a silicon nitride layer or a silicon carbide layer.

The protective layer 130 may be formed of dielectric material different from the etch stop layer 120 and the dielectric layer 140. In some embodiments, the protective layer 130 is an aluminum-based layer (Al-based layer). For example, the protective layer 130 is made from $AlO_x$, AlN, $AlN_yO_x$, other suitable material, or the combination thereof. In some other embodiments, the protective layer 130 may be a metal oxide layer containing other metals. By way of example, the protective layer 130 is a titanium oxide layer. In some embodiments, the protective layer 130 can be a single layer or a multi-layered structure.

The dielectric layer 140 in some embodiments is silicon carbide (SiC), silicon oxynitride (SiON), silicon nitride (SiN), silicon dioxide, the like, and/or combinations thereof. The dielectric layer 140 may be a single-layered structure or a multi-layered structure. The dielectric layer 140 may be formed by acceptable deposition techniques, such as chemical vapor deposition (CVD), atomic layer deposition (ALD), physical vapor deposition (PVD), the like, and/or a combination thereof.

Bottom electrode vias (BEVA) 150 are formed within the etch stop layer 120, the protective layer 130, and the dielectric layer 140 in the cell region CR. In some embodiments, at least one of the BEVAs 150 is a multi-layered structure and includes, for example, a diffusion barrier layer 152 and a filling metal 154 filling a recess in the diffusion barrier layer 152. An exemplary formation method of the BEVAs 150 includes etching openings in the layers 120-140, forming in sequence the diffusion barrier layer 152 and the filling metal 154 into the openings, and performing a planarization process, such as a chemical-mechanical polish (CMP) process, to remove excess materials of the filling metal 154 and the diffusion barrier layer 152 outside the openings. The remaining diffusion barrier layer 152 and the remaining filling metal 154 in the openings can serve as the BEVAs 150. In some embodiments, the BEVAs 150 are electrically connected to an underlying electrical component, such as a transistor, through the metallization pattern 114.

In some embodiments, the diffusion barrier layer 152 is a titanium nitride (TiN) layer or a tantalum nitride (TaN) layer, which can act as a suitable barrier to prevent metal diffusion. Formation of the diffusion barrier layer 152 may be exemplarily performed using CVD, PVD, ALD, the like, and/or a combination thereof. In some embodiments, the filling metal 154 is titanium (Ti), tantalum (Ta), platinum (Pt), ruthenium (Ru), tungsten (W), aluminum (Al), copper (Cu), TiN, TaN, the like, and/or combinations thereof. Formation of the filling metal 154 may be exemplarily performed using CVD, PVD, ALD, the like, and/or a combination thereof.

A blanket bottom electrode layer 160 is then formed over the BEVAs 150 and over the dielectric layer 140, so that the bottom electrode layer 160 extends along top surfaces of the BEVAs 150 and a top surface of the dielectric layer 140. The bottom electrode layer 160 can be a single-layered structure or a multi-layered structure. The bottom electrode layer 160 includes a material the same as the filling metal 154 in some embodiments. In some other embodiments, the bottom electrode layer 160 includes a material different from the filling metal 154. In some embodiments, the bottom electrode layer 160 is titanium (Ti), tantalum (Ta), platinum (Pt), ruthenium (Ru), tungsten (W), aluminum (Al), copper (Cu), TiN, TaN, the like, and/or a combination thereof. Formation of the bottom electrode layer 160 may be exemplarily performed using CVD, PVD, ALD, the like, and/or a combination thereof.

A buffer layer 170 is then formed over the bottom electrode layer 160. The buffer layer 170 may include a non-magnetic material. For example, the buffer layer 170 may include tantalum, aluminum, titanium, TiN, TaN, or the combination thereof. The buffer layer 170 may be deposited by PVD, ALD, CVD, or MOCVD (metal-organic chemical vapor deposition). Alternatively, the buffer layer 170 is deposited by an electroless plating process or other suitable process.

In some embodiments, portions of the bottom electrode layer 160 and the buffer layer 170 in the mark region MR are removed by suitable etching processes, and then openings MO are etched in the layers 120-140 in the mark region MR. The openings MO may serve as alignment mark used in mask aligning in the subsequent lithography processes. In some embodiments, the openings MO further extend into the metal/dielectric layers 110.

A resistance switching layer 180 is formed over the bottom electrode layer 160 and the buffer layer 170. In some embodiments, the resistance switching layer 180 may be a magnetic tunnel junction (MTJ) structure. To be specific, the resistance switching layer 180 includes at least a first magnetic layer, a tunnel barrier layer and a second magnetic layer are formed in sequence over the bottom electrode layer 160. In some embodiments, the resistance switching layer 180 may be conformally in the openings MO in the mark region MR.

In some embodiments, the first magnetic layer includes an anti-ferromagnetic material (AFM) layer over the bottom electrode layer 160 and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD, e-beam or thermal evaporation, or the like.

The ferromagnetic pinned layer in the first magnetic layer forms a permanent magnet and exhibits strong interactions with magnets. A direction of a magnetic moment of the ferromagnetic pinned layer can be pinned by an anti-ferromagnetic material (AFM) layer and is not changed during operation of a resulting resistance switching element (e.g. a MTJ stack) fabricated from the resistance switching layer 180. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD, ALD, e-beam or thermal evaporation, or the like. In some embodiments, the ferromagnetic pinned layer includes a multilayer structure.

The tunnel barrier layer is formed over the first magnetic layer. The tunnel barrier layer can also be referred to as a tunneling layer, which is thin enough that electrons are able to tunnel through the tunnel barrier layer when a biasing voltage is applied to a resulting resistance switching element (e.g. a MTJ stack) fabricated from the resistance switching layer 180. In certain embodiments, the tunnel barrier layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer includes sputtering, PVD, ALD, e-beam or thermal evaporation, or the like.

The second magnetic layer is formed over the tunnel barrier layer. The second magnetic layer is a ferromagnetic free layer in some embodiments. A direction of a magnetic moment of the second magnetic layer is not pinned because there is no anti-ferromagnetic material in the second magnetic layer. Therefore, the magnetic orientation of this layer is adjustable, thus the layer is referred to as a free layer. In some embodiments, the direction of the magnetic moment of the second magnetic layer is free to rotate parallel or anti-parallel to the pinned direction of the magnetic moment of the ferromagnetic pinned layer in the first magnetic layer. The second magnetic layer may include a ferromagnetic material similar to the material in the ferromagnetic pinned layer in the first magnetic layer. Since the second magnetic layer has no anti-ferromagnetic material while the first magnetic layer has an anti-ferromagnetic material therein, the first and second magnetic layers and have different materials. In certain embodiments, the second magnetic layer includes cobalt, nickel, iron or boron. An exemplary formation method of the second magnetic layer includes sputtering, PVD, ALD, e-beam or thermal evaporation, or the like.

In some embodiments where resistive random access memory (RRAM) cells are to be formed on the wafer, the resistance switching layer 180 may include a RRAM dielectric layer such as metal oxide composite, such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state.

A top electrode layer 190 is formed over the resistance switching layer 180. The top electrode layer 190 includes a conductive material. In some embodiments, the top electrode layer 190 is similar to the bottom electrode layer 160 in terms of composition. In some embodiments, the top electrode layer 190 includes titanium (Ti), tantalum (Ta), platinum (Pt), ruthenium (Ru), tungsten (W), aluminum (Al), copper (Cu), TiN, TaN, the like or combinations thereof. An exemplary formation method of the top electrode layer 190 includes sputtering, PVD, ALD, e-beam or thermal evaporation, or the like. In some embodiments, the top electrode layer 190 may referred to as a hard mask layer.

An oxide mask layer OM is subsequently formed over the top electrode layer 190. In some embodiments, the oxide mask layer OM includes oxide. For example, the oxide mask layer OM may include tetra-ethyl-ortho-silicate (TEOS) oxide, $SiO_x$, ashing removable dielectric (ARD), amorphous Si, SiOC, materials of a nitrogen free anti-reflection layer (NFARL), the like or combinations thereof. An exemplary formation method of the oxide mask layer OM includes PVD or thermal evaporation, or the like.

Figure 1C:
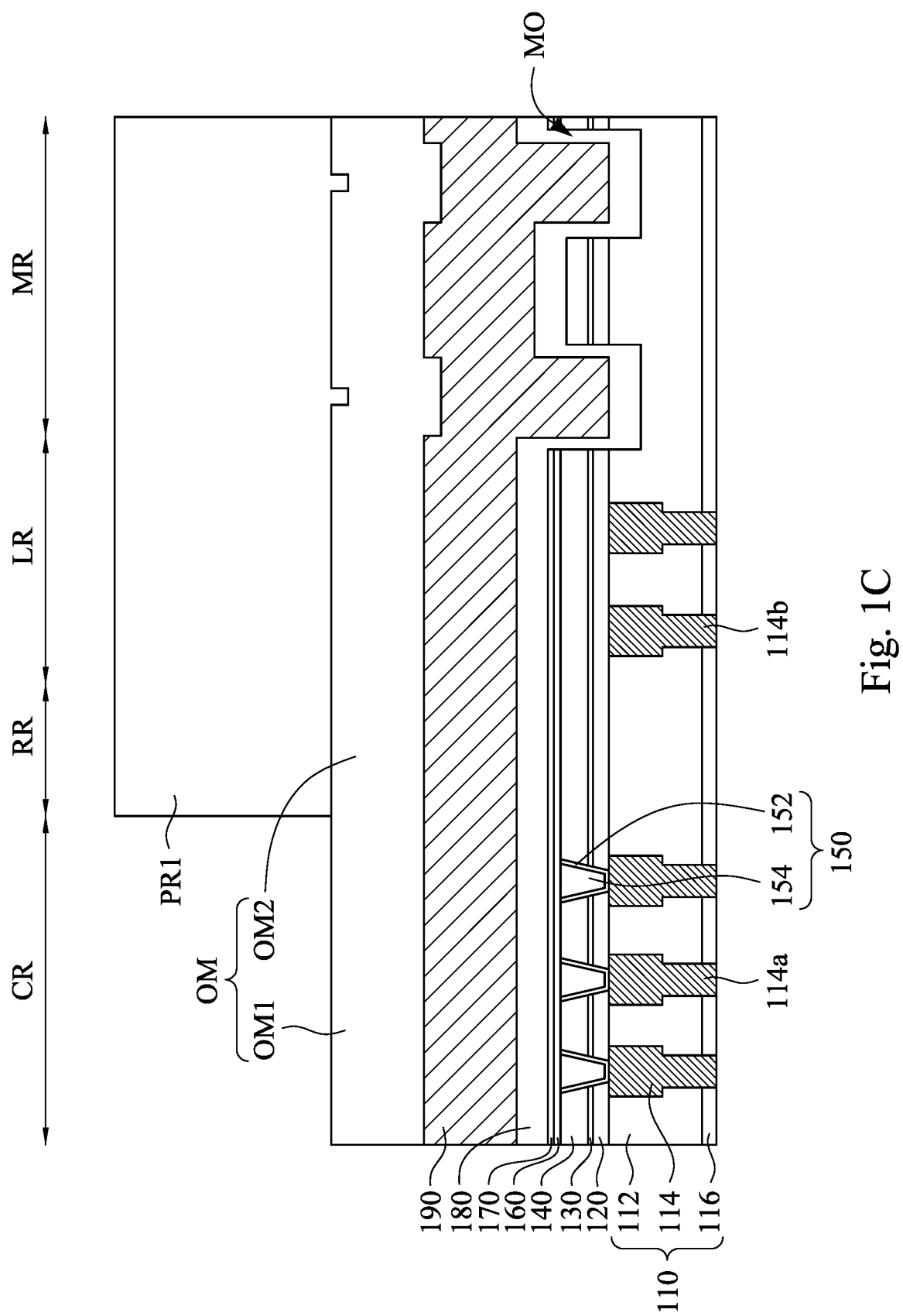

Referring to FIG. 1C, a resist mask PR1 is formed over the oxide mask layer OM in sequence. In some embodiments, the resist mask PR1 is a photoresist. In some embodiments, the patterned resist mask PR1 is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning (e.g., aligning a mask with respect to the openings MO), exposure, post-exposure baking, developing the photoresist, rinsing, drying (e.g., hard baking), other suitable processes, or combinations thereof. In some embodiments of the present disclosure, the resist mask PR1 covers the peripheral region RR, the logic region LR, and the mark region MR, but expose the cell region CR. For better illustration, it is noted that the oxide mask layer OM has a portion OM1 uncovered by the resist mask PR1 and a portion OM2 covered by the resist mask PR1.

Figure 1D:
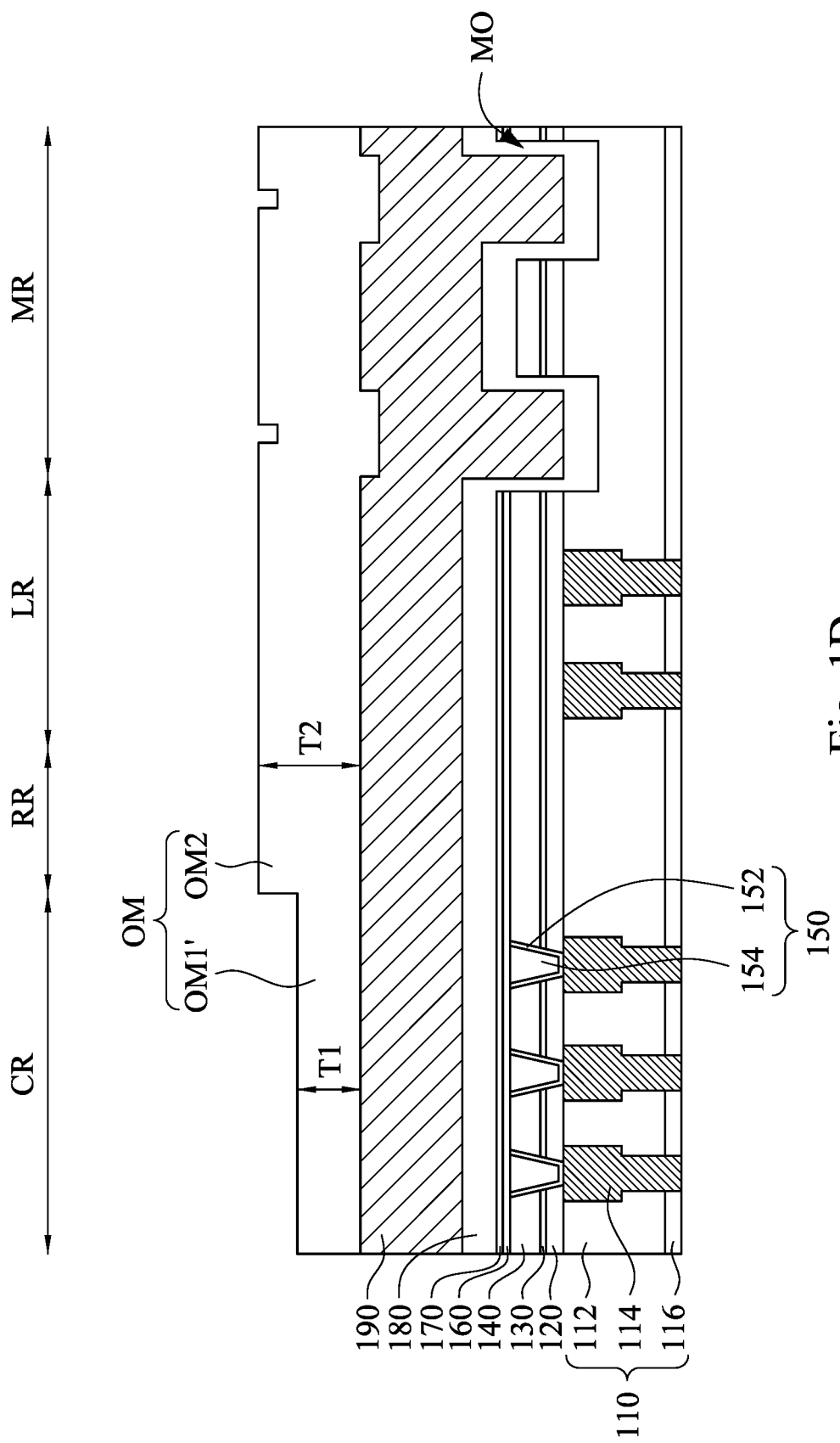

Reference is made to FIG. 1D. The portion OM1 of the oxide mask layer OM (referring to FIG. 1C) exposed by the resist mask PR1 is thinned by a suitable etching process. The etching process is performed to remove an upper part of the portion OM1 of the oxide mask layer OM, and the etching process stops before removing a lower part of the portion OM1. After the etching process, the remaining lower part of the portion OM1 is referred to as the portion OM1'. In some embodiments, the resist mask PR1 (referring to FIG. 1C) have a higher etch resistance to the etching process than that of the oxide mask layer OM. By the protection of the resist mask PR1 (referring to FIG. 1C), the portion OM2 remains substantially intact after the etching process. For example, a thickness T1 of the portion OM1' is less than a thickness T2 of the portion OM2. After the etching process, the resist mask PR1 (referring to FIG. 1C) may be removed using, for example, an ash process, after the etching process.

Figure 1E:
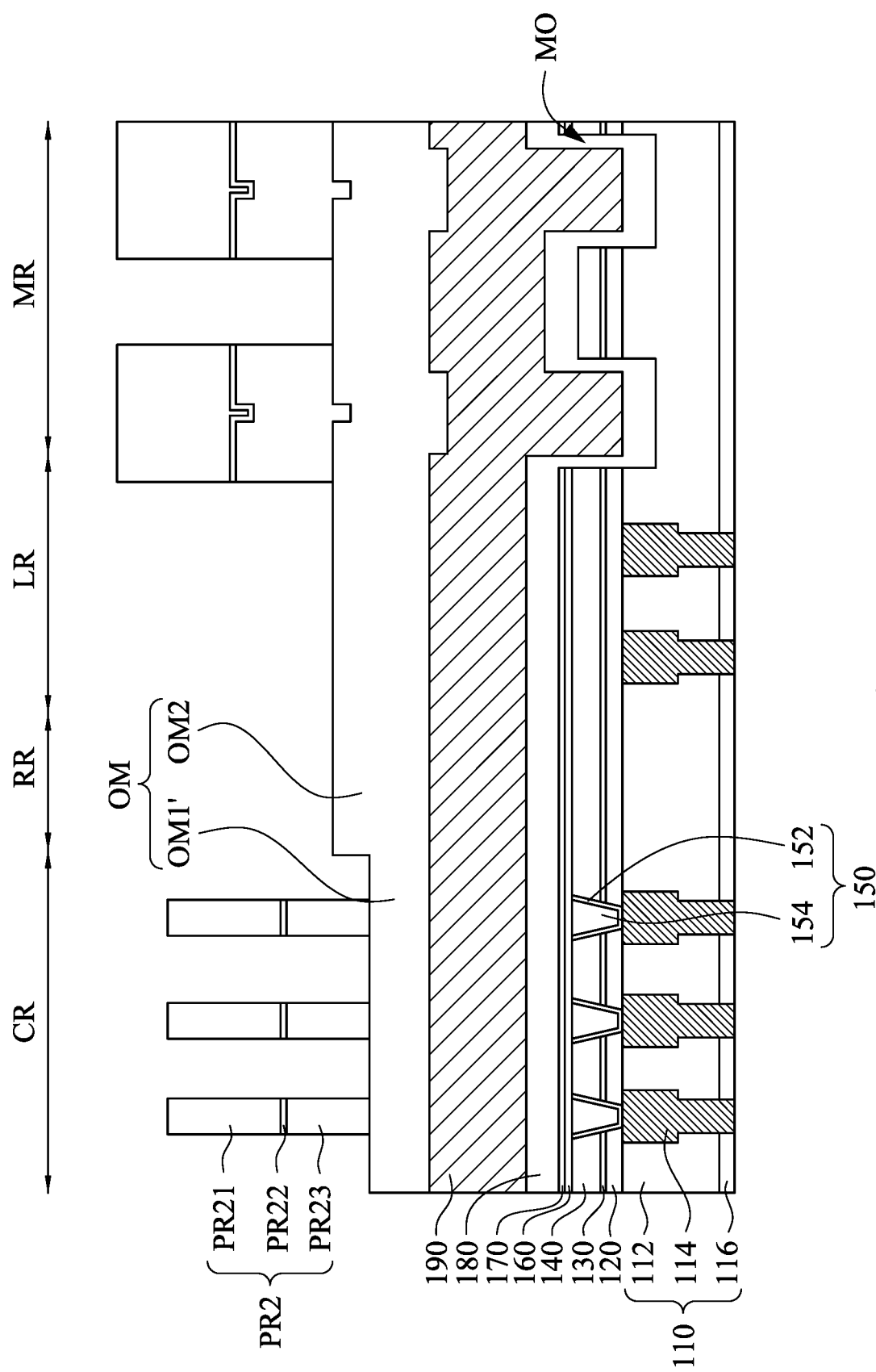

Reference is made to FIG. 1E. A tri-layer photoresist PR2 may be formed over the oxide mask layer OM. The tri-layer photoresist PR2 includes a photoresist layer PR21 as the top or uppermost portion, a middle layer PR22, and a bottom layer PR23. The middle layer PR22 may include anti-reflective layers or backside anti-reflective layers to aid in the exposure and focus of the photoresist processing. The bottom layer PR23 may be a hard mask material, for example, a nitride. The photoresist layer PR21 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the photoresist layer PR21. This photoresist layer PR21 is then used to etch the underlying middle layer PR22 and bottom layer PR23 to form an etch mask for the target layer, for example, herein, the oxide mask layer OM. The oxide mask layer OM may have a higher etch resistance to the etching process than that of the bottom layer PR23, such that the etching process stops when reaching the oxide mask layer OM. In some other embodiments, the middle layer PR22 and the bottom layer PR23 can be omitted. That is, the photoresist PR2 is a single-layer photoresist. Prior to patterning the photoresist layer PR21, a mask in an exposure tool may be aligned with respect to the alignment mark (e.g., the openings MO).

Figure 1F:
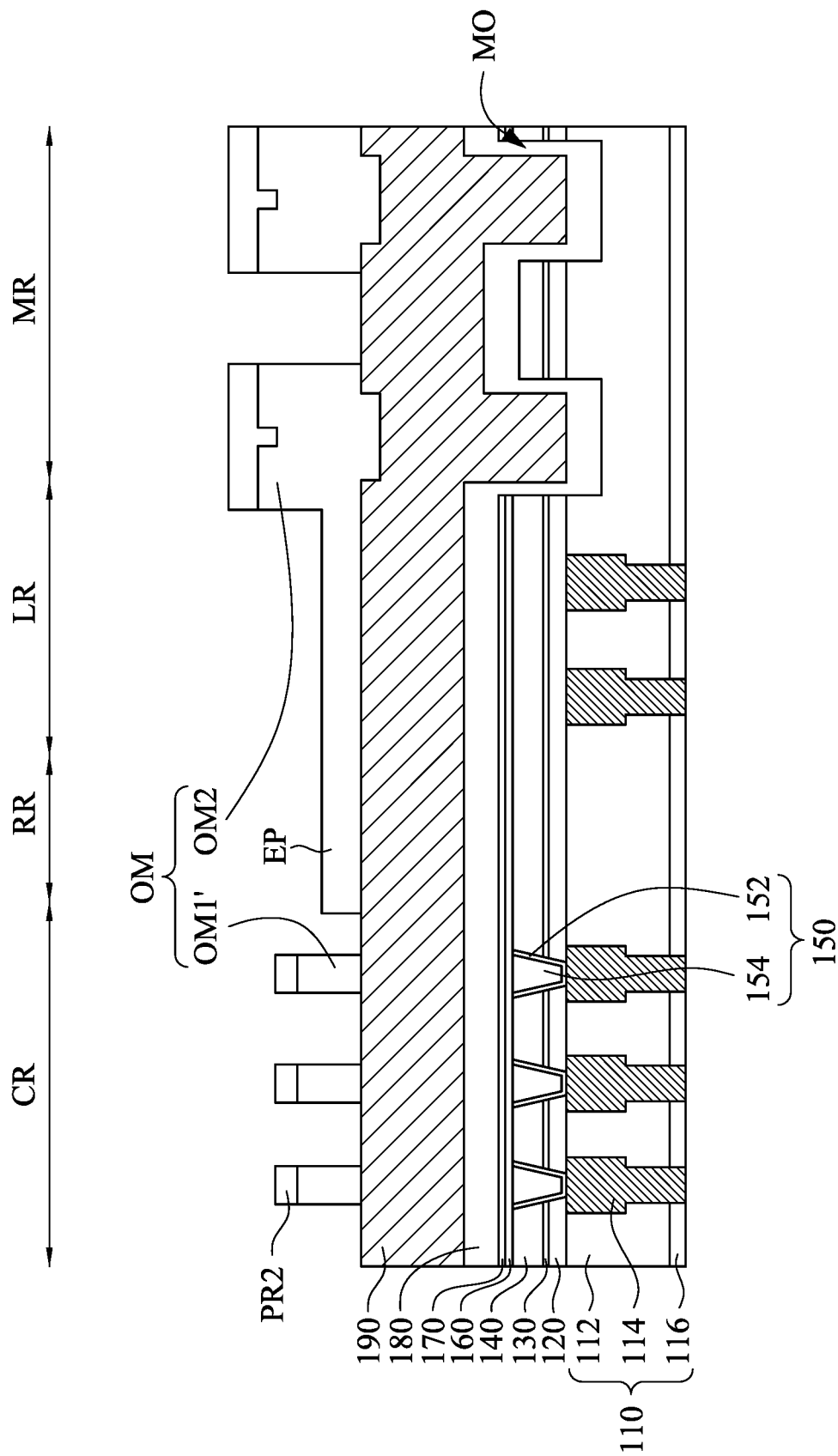

Reference is made to FIG. 1F. One or more etching processes are performed to pattern the oxide mask layer OM. Herein, the photoresist PR2 may have higher etch resistance to the etching processes than that of the oxide mask layer OM, and may serve as an etch mask during etching the oxide mask layer OM. Through the configuration, after the etching process, parts of the portions OM1' and OM2 exposed by the photoresist PR2 are etched, and the other parts of the portions OM1' and OM2 covered by the photoresist PR2 remain intact. Herein, the etching process may be controlled such that while the parts of the portion OM1' exposed by the photoresist PR2 are removed, the part of the portion OM2 exposed by the photoresist PR2 is thinned and remains over the peripheral region RR and the logic region LR. The thinned part of the portion OM2 is referred to as an extending part EP hereinafter. For example, the etching process may stop when the underlying top electrode layer 190 in the cell region CR is exposed, and due to the thickness difference between the portions OM1' and OM2 (referring to FIG. 1E), the portion OM2 has the extending part EP over the top electrode layer 190. In some embodiments, the top electrode layer 190 in the cell region CR may be slightly consumed during the etching process.

In the present embodiments, the etching processes includes a dry etch, a wet etch, or a combination of dry etch and wet etch. The dry etching process may implement suitable etching gas (e.g., $CF_4$, $SF_6$, $CH_2F_2$, $CHF_3$, $N_2$, $H_2$, He, $CH_xF_y$, $NF_3$, $SF_6$, $C_4F_6$, $CH_4$, $BCl_3$, $Cl_2$ and/or HBr, oxygen-containing gas, iodine-containing gas, other suitable gases and/or plasmas, or combinations thereof. The etching process may include a multiple-step etching to gain etch selectivity, flexibility and desired etch profile. In some embodiments, the portion OM2 of the oxide mask layer OM in the mark region MR is further etched by additional etching processes, such that parts of the portion OM2 exposed by the photoresist PR2 in the mark region MR is removed to expose the underlying top electrode layer 190 in the mark region MR. After the etching processes, portions of the photoresist PR2 (e.g., the photoresist layer PR21 and the middle layer PR22 in FIG. 1E) may be removed, and portions of the photoresist PR2 (e.g., the bottom layer PR23 in FIG. 1E) may remain.

Figure 1G:
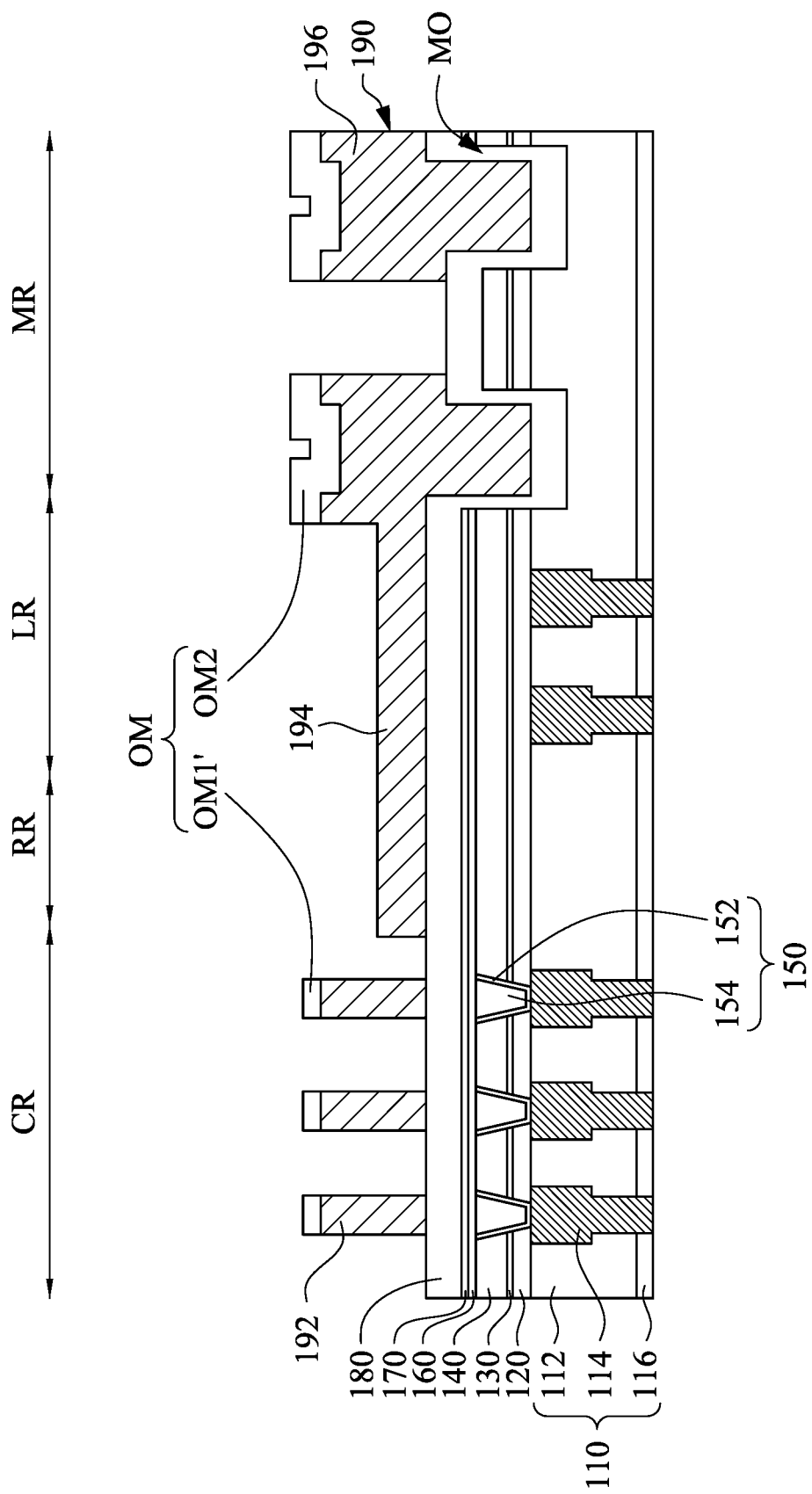

Reference is made to FIG. 1G. One or more etching processes are performed to pattern the top electrode layer 190 (referring to FIG. 1F). The etching process may include a dry etch, a wet etch, or a combination of dry etch and wet etch. The etching gas including $Cl_2$, $CH_4$, $N_2$, Ar, He, HBr, $BCl_3$, $CF_4$, $CH_xF_y$, $O_2$, $SF_6$, $NF_3$, and other suitable gas. In some embodiments, the etching process is performed with a transformer coupled plasma (TCP) source in a range from about 50 Volts to about 1200 Volts and a bias voltage in a range from about 60 Volts to about 1000 Volts. Herein, the patterned oxide mask layer OM (referring to FIG. 1F) may have a higher etch resistance to the etching process than that of the top electrode layer 190. That is, an etching rate of the patterned oxide mask layer OM is lower than an etching rate of the top electrode layer 190 in the etching process. For example, the etch selectivity ratio of the etching rate of the top electrode layer 190 to the etching rate of the patterned oxide mask layer OM is greater than about 1. For example, the etch selectivity ratio is greater than about 6.

During the etching processes, the patterned oxide mask layer OM may serve as an etch mask, and portions of the top electrode layer 190 exposed by the patterned oxide mask layer OM are removed. After the etching process, portions of the top electrode layer 190 protected by the patterned oxide mask layer OM in the region CR may be referred to as top electrodes 192, and portions of the top electrode layer 190 protected by the patterned oxide mask layer OM in the mark region MR may be referred to as top electrodes 196. The top electrodes 192 may be over the BEVAs 150 respectively.

Herein, the etching process may be controlled such that while the portions of the top electrode layer 190 in the region CR exposed by the patterned oxide mask layer OM are removed, a portion of the top electrode layer 190 under the extending part EP (referring to FIG. 1F) is thinned and remains over the peripheral region RR and the logic region LR. For example, the etching process may initially remove the extending part EP (referring to FIG. 1F), and then removing an upper part of the top electrode layer 190 under the extending part EP. The etching process may stop when the underlying resistance switching layer 180 in the cell region CR is exposed, such that a bottom part of the top electrode layer 190 remains in the peripheral region RR and the logic region LR and referred to as the extending portion 194.

Through the configuration, the extending portion 194 is thinner than the top electrodes 192. For example, the extending portion 194 has a thickness in a range of about 10 nanometers to about 30 nanometers, and the top electrodes 192 herein have a thickness in a range of about 50 nanometers to about 120 nanometers. After the etching process, the photoresist layer PR2 may be removed, and the height of the patterned oxide mask layer OM is reduced.

Figure 1H:
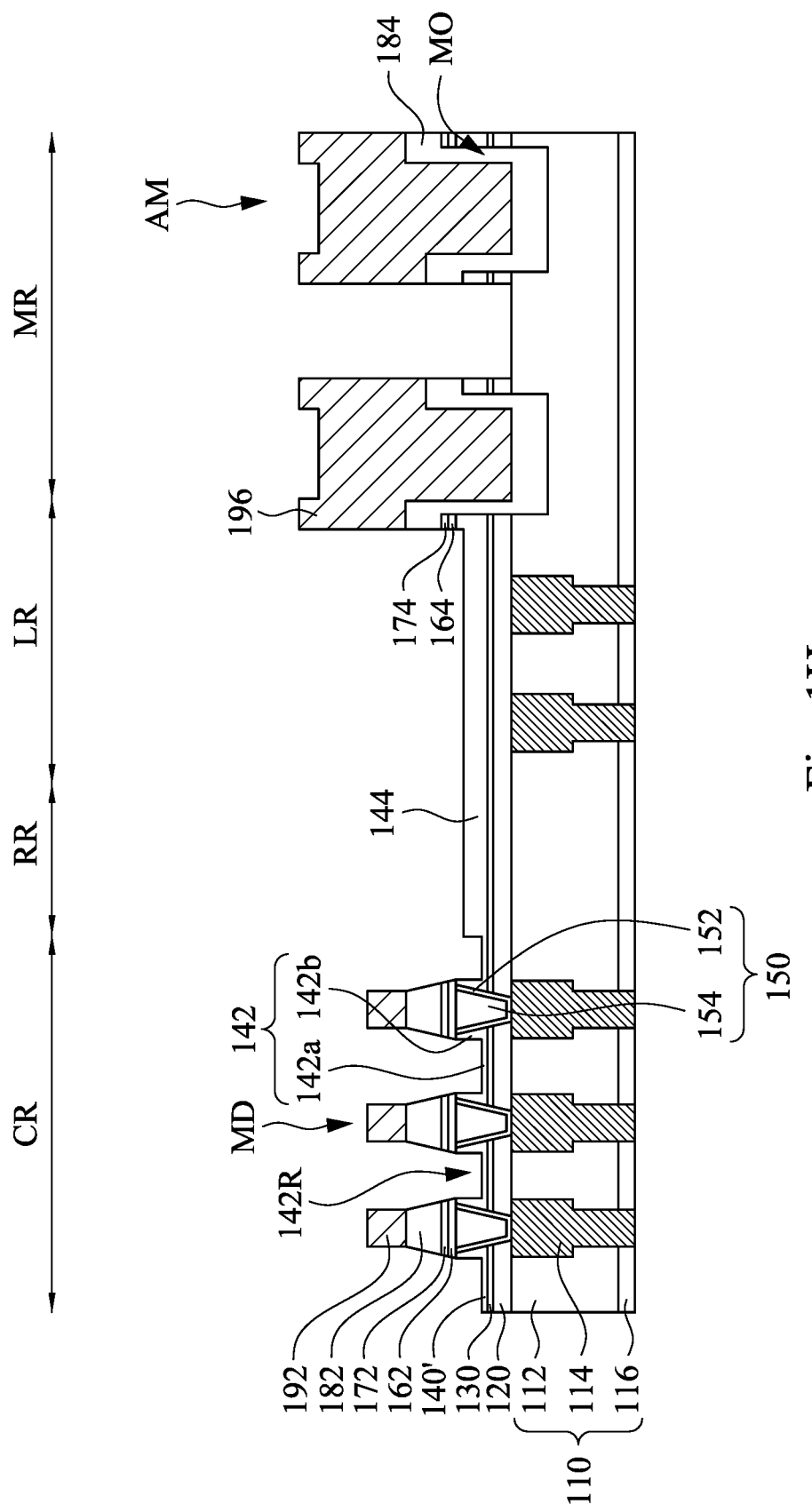

Reference is then made to FIG. 1H. One or more etching processes are performed to pattern the resistance switching layer 180, the buffer layer 170, and the bottom electrode layer 160 (referring to FIG. 1G). The etching processes may include a dry etch, a wet etch, or a combination of dry etch and wet etch. For example, the etching process includes a reactive ion etch (RIE), an ion-beam etching (IBE) process, and other suitable process. In some embodiments, the top electrode layer 190 (referring to FIG. 1G) may have an etch resistance to the etching process similar to that of the layers 160-180 (referring to FIG. 1G). That is, in some embodiments, an etching rate of the patterned top electrode layer 190 (referring to FIG. 1G) is substantially equal to an etching rate of the layers 160-180 (referring to FIG. 1G) in the etching process. The top electrode layer 190 is designed with suitable thickness for protecting portions of the layers 160-180 (referring to FIG. 1G) while etching another portions of the layers 160-180 exposed by the top electrode layer 190. For example, the top electrodes 192 in FIG. 1G have a thickness in a range of about 50 nanometers to about 120 nanometers, which is greater than a thickness of the layers 160-180. Therefore, the etching process can remove upper parts of the top electrodes 192 and stop when bottom parts of the top electrodes 192 remain. In some other embodiments, the top electrode layer 190 (referring to FIG. 1G) may have an etch resistance to the etching process higher than that of the layers 160-180 (referring to FIG. 1G). That is, the etching rate of the patterned top electrode layer 190 (referring to FIG. 1G) may be lower than the etching rate of the layers 160-180 (referring to FIG. 1G) in the etching process.

Through the etching process, the resistance switching layer (referring to FIG. 1G) is patterned to form at least one resistance switching element 182 in the cell region CR and a resistance switching element 184 in the mark region MR. The buffer layer 170 (referring to FIG. 1G) is patterned to form at least one buffer 172 in the cell region CR and buffer residues 174 in the mark region MR. The bottom electrode layer 160 (referring to FIG. 1G) is patterned to form at least one bottom electrode 162 in the cell region CR and bottom electrode residues 164 in the mark region MR. In some embodiments, memory devices MD are formed in the cell region CR. For example, each of the memory device MD includes the top electrode 192, the resistance switching element 182, the buffer 172, the bottom electrode 162, and the BEVA 150. In some embodiments, alignment marks AM are formed in the mark region MR. For example, each of the alignment marks AM includes the top electrode 196 and the resistance switching element 184.

In some embodiments, byproducts of the etching process may settle as re-deposited films around the sidewalls of memory device MD, and the re-deposited films may act as leakage paths along the sidewalls, thereby reducing the magnetic resistance (MR) ratio of the memory device MD. Directional etching process, such as IBE process, may be implemented for reducing the effects of re-deposited films. The IBE process may comprise an etchant gas such as a CHF series (e.g., $CHF_2$, $CHF_3$, $CF_4$, $CH_xF_y$, or $CH_3OH$), Kr, Ne, Ar, O, N, the like, or a combination thereof. The angle of incidence of the ions during the IBE process may be controlled and modified to remove the re-deposited films. The IBE process generates a neutralization species as the etchant and will not damage and/or oxidize the top electrode 192 and 196 and the sidewalls of the memory device MD. The IBE process may be performed in a chamber with a rotatable stage or substrate table with more than one axis of rotation. This rotation allows a more uniform etch profile and allows control of the angle of incidence of the ion beam.

The dielectric layer 140 (referring to FIG. 1G) not protected by the patterned top electrode layer 190 may be etched during the etching processes in forming the memory device MD and the directional etching process, such that recesses 142R are formed in a portion 142 of the dielectric layer 140' in the cell region CR, in which the etched dielectric layer 140 is referred to as the dielectric layer 140'. In some embodiments, the amount of the re-deposition film is less when the recesses 142R get deeper. However, due to the presence of the memory devices MD, the cell region CR is more dense than that of the logic region LR and the peripheral region RR, which in turn will result in that the dielectric layer 140 in the regions LR and RR is etched more than the dielectric layer 140 in the cell region CR. In absence of the extending part EP (referring to FIG. 1F) and the extending portion 194 (referring to FIG. 1G), when the recesses CR is etched deeper for reducing the amount of the re-deposition film, the dielectric layer 140, the protective layer 130, and the etch stop layer 120 in the regions LR and RR may be punched through, and exposing the underlying metallization pattern 114.

In some embodiments of the present disclosure, through the configuration of the extending portion 194 (referring to FIG. 1G), the layers 160-180 (referring to FIG. 1G) under the extending portion 194 (referring to FIG. 1G) are etched later than etching the layers 160-180 in the cell region CR exposed by the top electrodes 192 (referring to FIG. 1G), such that the dielectric layer 140 under the extending portion 194 (referring to FIG. 1G) is etched less than the dielectric layer 140 in the cell region CR exposed by the top electrodes 192. The etching processes in forming the memory device MD and the directional etching process may be controlled such that the layers 160-180 exposed by the patterned top electrode layer 190 (referring to FIG. 1G) are removed, and a portion of the dielectric layer 140 in the peripheral region RR and the logic region LR is slightly etched or not etched. For example, the etching process may remove the extending portion 194 (referring to FIG. 1G), but not remove the dielectric layers 140 under the extending portion 194 (referring to FIG. 1G). In some examples, the etching process may remove the extending portion 194 (referring to FIG. 1G) and an upper part of the dielectric layers 140 under the extending portion 194 (referring to FIG. 1G). After the etching process, the dielectric layers 140 has the extending portion 144 in the peripheral region RR and the logic region LR.

Herein, the top electrodes 192 (referring to FIG. 1G) may have a higher etch resistance to the etching process than that of the dielectric layer 140 (referring to FIG. 1G), and may serve as an etch mask during the etching processes. That is, an etching rate of the patterned top electrode layer 190 (referring to FIG. 1G) is lower than an etching rate of the dielectric layer 140 (referring to FIG. 1G) in the etching process in forming the memory device MD and the directional etching process. For example, the etch selectivity ratio of the etching rate of the dielectric layer 140 to the etching rate of the top electrodes 192 or the extending portion 194 (referring to FIG. 1G) is greater than 1. For example, the etch selectivity ratio is about 2. In some embodiments, a thickness of the extending portion 194 (referring to FIG. 1G) is designed according to the etch selectivity ratio between the dielectric layer 140 and the top electrode layer 190. In some examples where the etch selectivity ratio is about 2, the thickness of the extending portion 194 is designed to be less than or equal to half the total thickness of the protective layer 130 and the dielectric layer 140. Through the configuration, the extending portion 194 may be removed when the recesses 142R are formed in the portion 142 of the dielectric layer 140'.

Herein, the portion 142 of the dielectric layer 140' includes bottom parts 142a and side parts 142b. The side parts 142b are thicker than the bottom parts 142a and surround the BEVAs 150 respectively. In some embodiments, the extending portion 144 of the dielectric layer 140' is thicker than the bottom part 142a of the portion 142. In the present embodiments, one of the bottom parts 142a of the portion 142 of the dielectric layers 140 adjacent the peripheral region RR may have the same thickness as another of the bottom parts 142a of the portion 142 between the memory devices MD. In some embodiments where the dielectric layer 140 under the extending portion 194 (referring to FIG. 1G) may also be etched, a top surface of the portion 144 is at a position lower than that of the side part 142b of the portion 142. In some embodiments where the dielectric layer 140 under the extending portion 194 (referring to FIG. 1G) is not etched, the top surface of the portion 144 is at a position substantially level with that of the side part 142b of the portion 142 of the dielectric layer 140.

In the present embodiments, the thickness of the portion 144 of the dielectric layer 140' may be calculated from the etch selectivity between the top electrode layer 190 and the resistance switching layer 180 during patterning the resistance switching layer 180, the etch selectivity between the top electrode layer 190 and the dielectric layer 140 during IBE etching, and the etch selectivity between the top electrode layer 190 and oxide mask layer OM during patterning the top electrode layer 190. After the etching processes, the patterned oxide mask layer OM' may be removed, and the height of the top electrodes 192 may be reduced.

Figure 1I:
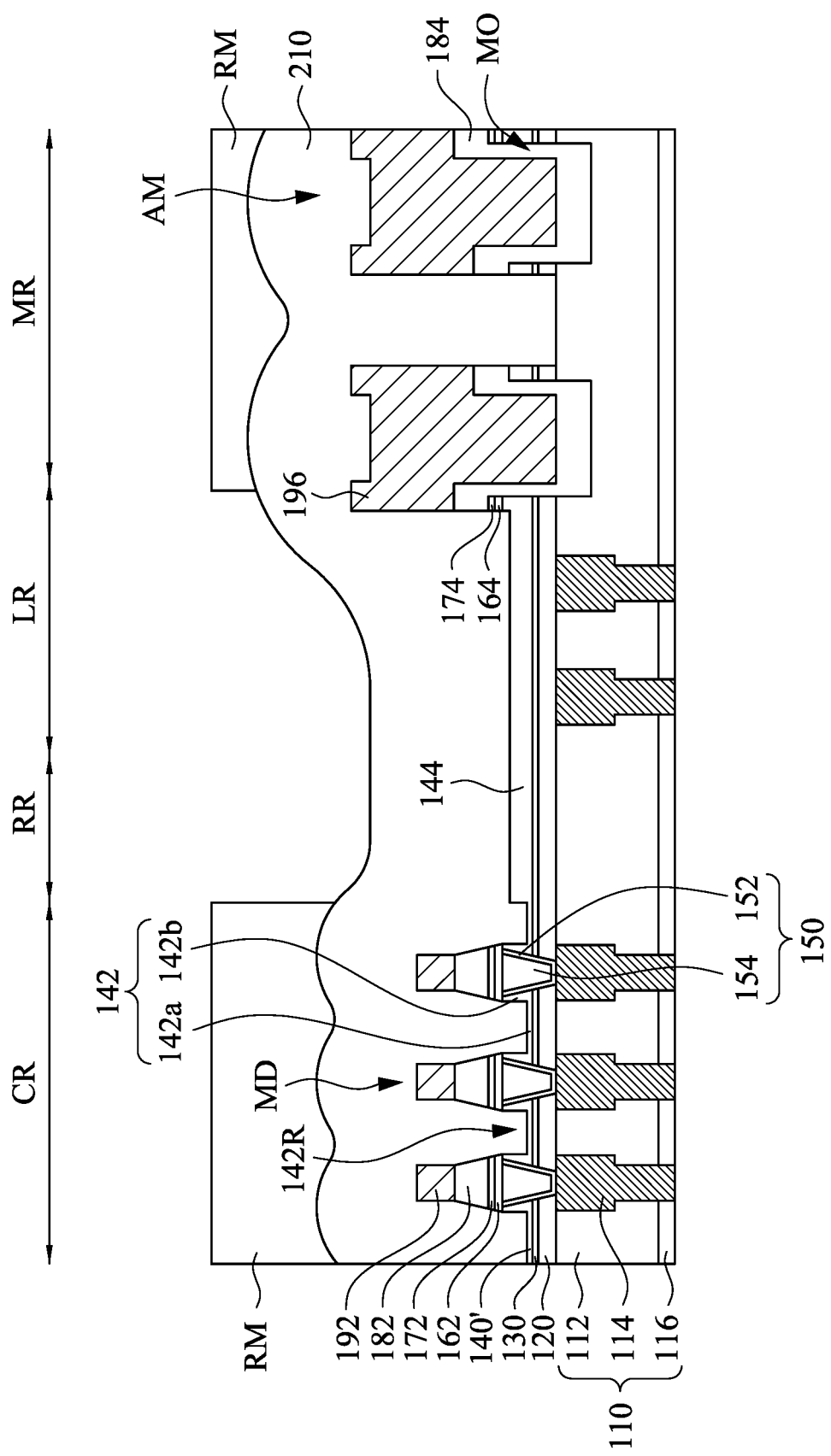

Reference is made to FIG. 1I. An ILD layer 210 is formed over the structure of FIG. 1H. In some embodiments, the ILD layer 210 may have the same material as the ILD layer 112. In some other embodiments, the ILD layer 210 may have a different material than that of the ILD layer 112. In some embodiments, the ILD layer 210 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. An anti-reflection layer, for example, a nitrogen-free anti-reflection layer (NFARL) is optionally formed over the ILD layer 210.

Subsequently, a resist mask RM may be formed over the ILD layer 112. The resist mask RM is formed by patterning a resist layer (e.g., a photoresist layer) using a suitable photolithography process. The resist mask RM may cover the regions CR and MR and exposes the regions RR and LR.

Figure 1J:
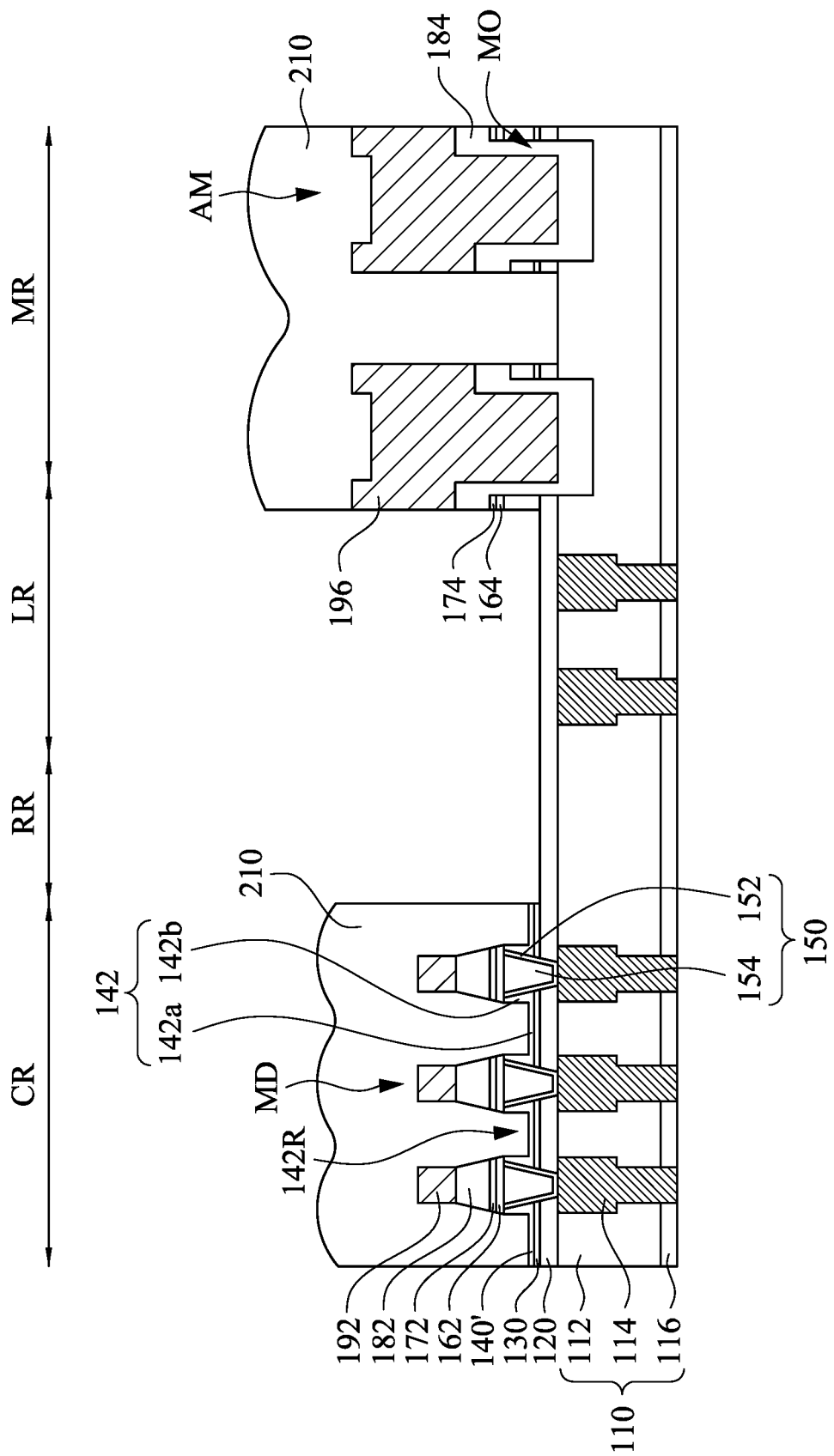

Reference is then made to FIG. 1J. A first etch process is performed to remove the dielectric layers in the peripheral region RR and the logic region LR. In some embodiments where the ILD layer 210 and the dielectric layer 140' are silicon oxide, the etchant used in the first etch process can be dilute hydrofluoric acid (HF), HF vapor, $CF_4$, $C4F_8$, $CH_xF_y$, $C_xF_y$, $SF_6$, or $NF_3$, Ar, $N_2$, $O_2$, Ne, CO, $CO_2$, gas for removing the ILD layer 210 and the dielectric layer 140'. In some embodiments, the protective layer 130 may has a higher etch resistance to the first etch process than that of the ILD layer 210 and the dielectric layer 140', such that the first etch process may stop at the protective layer 130 and not damage the underlying etch stop layer 120.

A second etch process is performed to remove the protective layer 130 in the peripheral region RR and the logic region LR. The second etch process may dry etching, atomic layer etching (ALE), wet etching, or the combination thereof. In some embodiments, the etch stop layer 120 may has a higher etch resistance to the second etch process than that of the protective layer 130, such that the second etch process may stop at the etch stop layer 120 and not damage the underlying metallization pattern 114. After the removal, the protective layer 130 is not in the regions RR and LR.

Figure 1K:
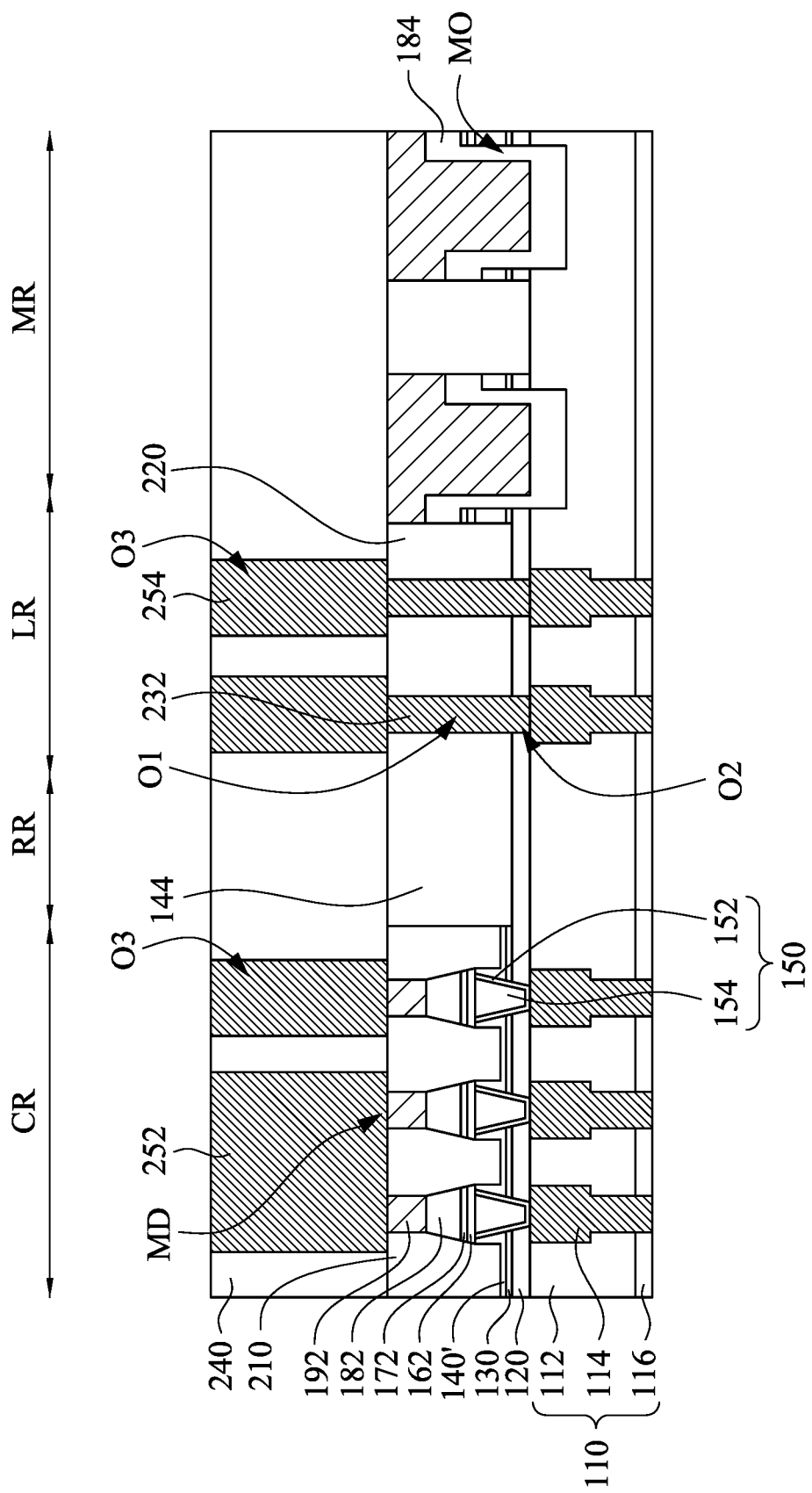

Reference is then made to FIG. 1K. An ILD layer 220 is formed over the logic region LR and the peripheral region RR of the structure of FIG. 1J, and then a metallization pattern 232 is formed in the ILD layer 220 and connected to the metallization pattern 114 in the logic region. The metallization pattern 232 may be plural metal vias. For example, the formation of the metallization pattern 232 may include etching openings O1 in the ILD layer 220, etching openings O2 in the etch stop layer 120, and overfilling the openings O1 and O2 with a metal material. The etch stop layer 120 may have a higher etch resistance to etching the openings O1 in the ILD layer 220 than that of the ILD layer 220. In some embodiments, a polish process, such as chemical-mechanical polish process may be performed to remove an excess portion of the metal material outside the openings O1 of the ILD layer 220.

In some embodiments, the ILD layer 220 may have the same material as the ILD layers 210 and 112. In some other embodiments, the ILD layer 220 may have a different material than the ILD layers 210 or 112. In some embodiments, the ILD layer 2420 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. Herein, since the ILD layers 210 and 220 are formed at different operations, there is a clear interface between the ILD layers 210 and 220. Also, since the ILD layer 220 and the dielectric layer 140' are formed at different operations, there is a clear interface between the ILD layer 220 and the dielectric layer 140'.

Subsequently, an ILD layer 240 is formed over the cell region CR, the logic region LR, and the peripheral region RR, and then metallization patterns 252 and 254 are formed in the ILD layer 220. The metallization patterns 252 and 254 are connected to the memory device MD in the cell region CR and the metallization pattern 232 in the logic region LR, respectively. For example, the formation of the metallization patterns 252 and 254 may include etching openings O3 in the ILD layer 240, overfilling the openings O3 with a metal material, and removing an excess portion of the metal material outside the openings O3 of the ILD layer 240. In present embodiments, a height of the metallization pattern 232 may be equal to a height of the memory device MD. The metallization pattern 232 serves a $M_x$ metal layer, the metallization pattern 114 serves a $M_{x-1}$ metal layer, and the metallization patterns 252 and 254 serves a $M_{x+1}$ metal layer.

Figure 2:
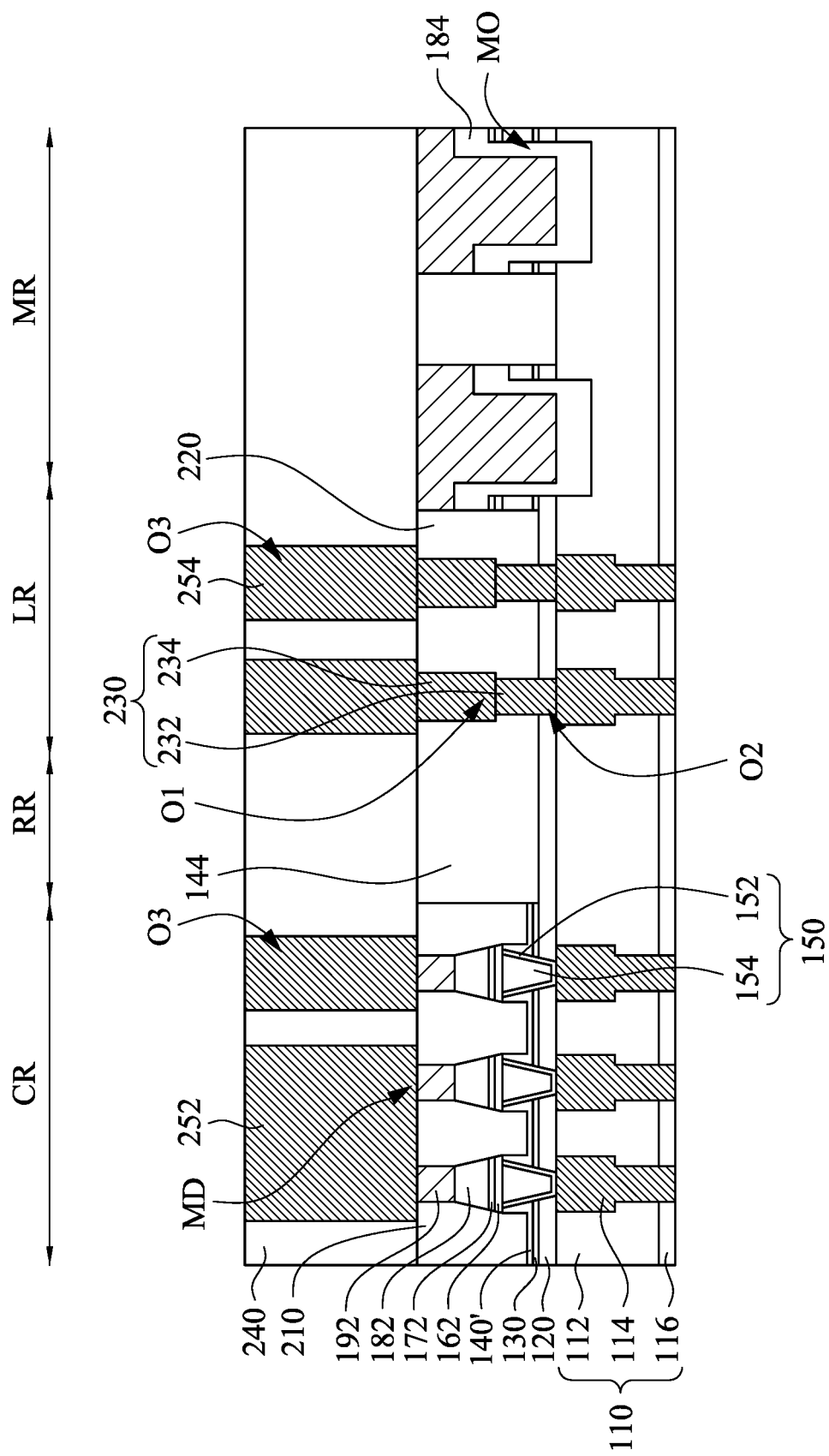
FIG. 2 is a cross-sectional view of an integrated circuit according to various embodiments of the present disclosure.

FIG. 2 is a cross-sectional view of an integrated circuit according to various embodiments of the present disclosure. The present embodiments are similar to those of FIG. 1K, and the difference between the present embodiments and the embodiments of FIG. 1K is that a metallization pattern 230 including metal vias 232 and metal lines 234 is formed in the ILD layer 220 before the formation of the ILD 240 and the metallization patterns 252 and 254. In some examples, a height of the metallization pattern 230 may be equal to a height of the memory device MD. The metallization pattern 230 serves a $M_x$ metal layer, the metallization pattern 114 serves a $M_{x-1}$ metal layer, and the metallization pattern 254 serves a $M_{x+1}$ metal layer.

FIGS. 3A-3G are cross-sectional views of an integrated circuit at various intermediate stages of manufacture according to various embodiments of the present disclosure. The embodiments of FIGS. 3A-3G are similar to that of FIGS. 1A-1K, and at least one difference between the embodiments of FIGS. 3A-3G and the embodiments of FIGS. 1A-1K is that: the cell region CR has an operable cell region OCR where the memory devices are to be formed and a dummy cell region DCR where dummy devices are to be formed, and the portion 144 of the dielectric layer 140 (referring to FIG. 1I) further extends to the dummy cell region DCR. The illustration is merely exemplary and is not intended to be limiting beyond what is specifically recited in the claims that follow. It is understood that additional operations may be provided before, during, and after the operations shown by FIGS. 3A-3G, and some of the operations described below can be replaced or eliminated for additional embodiments of the method. The order of the operations/processes may be interchangeable.

Figure 3A:
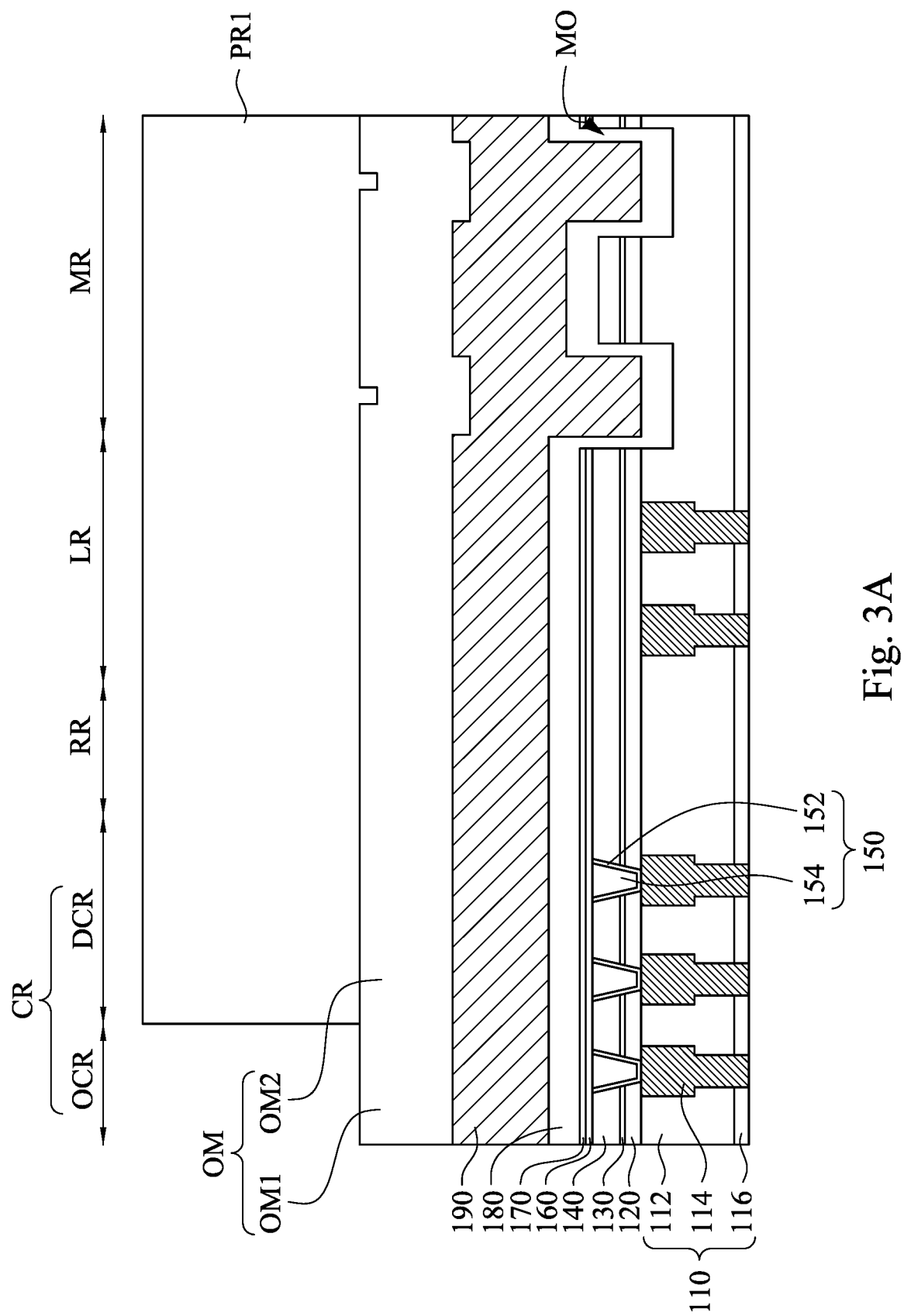
FIGS. 3A-3G are cross-sectional views of an integrated circuit at various intermediate stages of manufacture according to various embodiments of the present disclosure.

FIG. 3A illustrates a substrate having a metal/dielectric layers 110 and plural layers thereon. The substrate having the metal/dielectric layers 110 has a logic region LR, a peripheral region RR, a cell region CR, and a mark region MR. In the present embodiments, the cell region CR may further have an operable cell region OCR and a dummy cell region DCR adjacent the operable cell region OCR. The etch stop layer 120, the protective layer 130, the dielectric layer 140, the BEVAs 150, the blanket bottom electrode layer 160, the buffer layer 170, the resistance switching layer 180, the top electrode layer 190, the oxide mask layer OM, and the resist mask PR1 are formed over the metal/dielectric layers 110.

In the present embodiments, the resist mask PR1 covers the peripheral region RR, the logic region LR, the mark region MR, and the dummy cell region DCR, but exposes the operable cell region OCR. The oxide mask layer OM has a portion OM1 uncovered by the resist mask PR1 and a portion OM2 covered by the resist mask PR1. In this context, portions of the BEVAs 150 in the dummy cell region DCR may be referred to as dummy BEVAs. In some other embodiment, portions of the BEVAs 150 and portions of the metallization pattern 114 in the dummy cell region DCR may be omitted. That is, the resulted memory device MD (referring to FIG. 3G) in the dummy cell region DCR may not locate on the BEVAs 150 and the metallization pattern 114. Other details of the present embodiments are similar to those aforementioned, and not repeated herein.

Figure 3B:
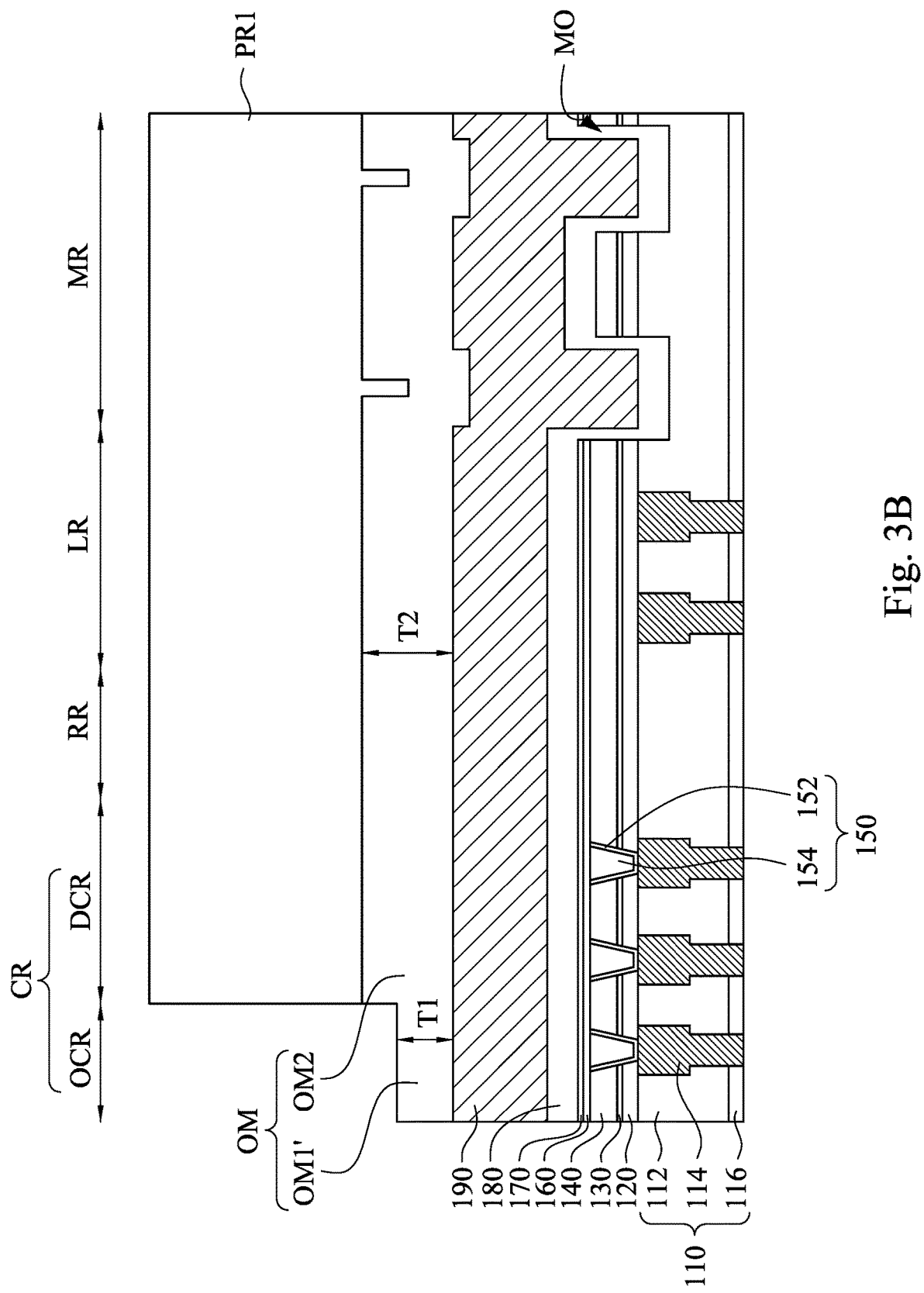

Reference is made to FIG. 3B. The portion OM1 of the oxide mask layer OM exposed by the resist mask PR1 is thinned by an etching process. The etching process is performed to remove an upper part of the portion OM1 of the oxide mask layer OM, and the etching process stops before removing a lower part of the portion OM1. After the etching process, the remaining lower part of the portion OM1 is referred to as the portion OM1'. A thickness T1 of the portion OM1' is less than a thickness T2 of the portion OM2 of the oxide mask layer OM covered by the resist mask PR1. After the etching process, the resist mask PR1 may be removed using, for example, an ash process, after the etching process.

Figure 3C:
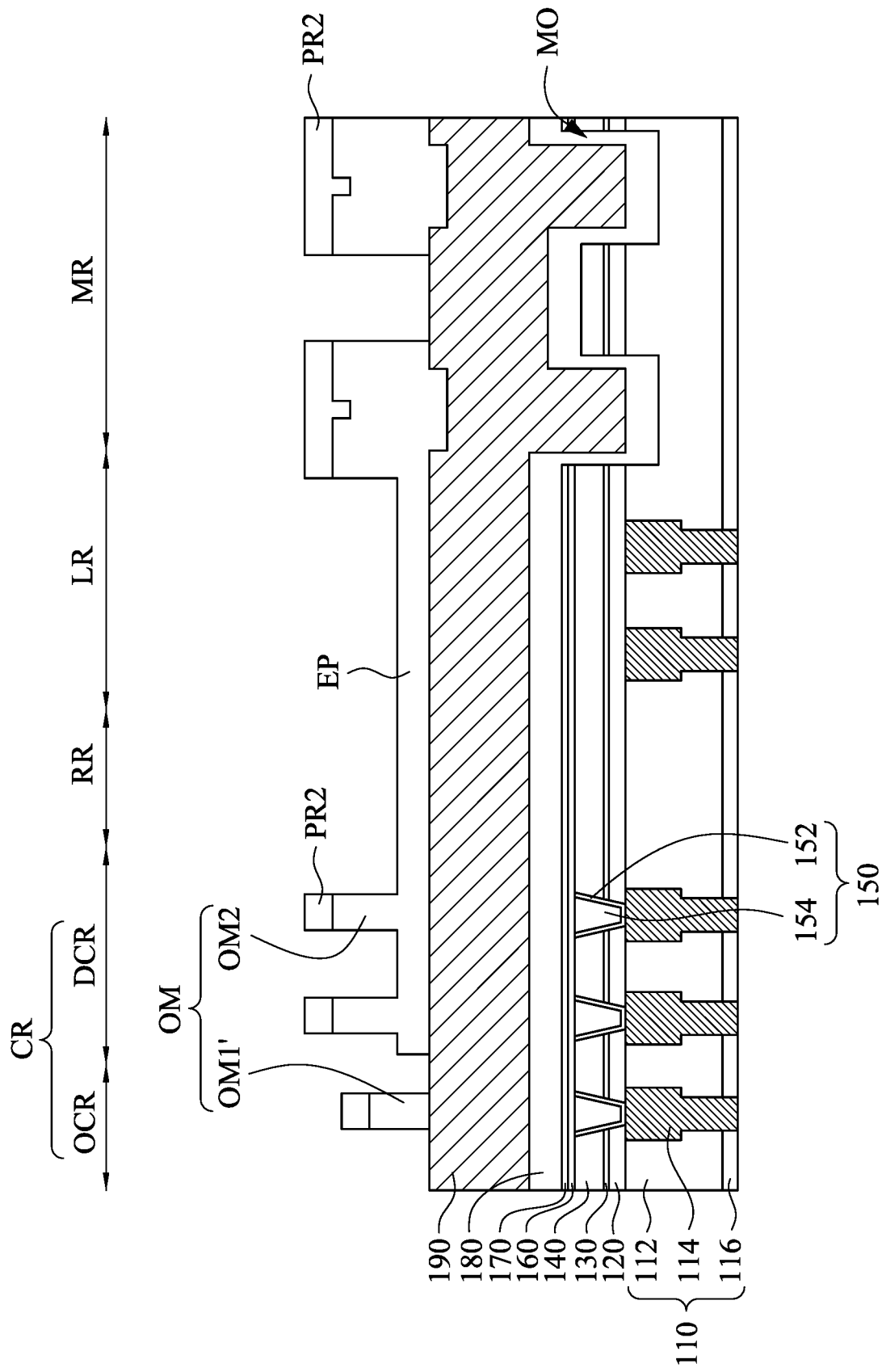

Reference is made to FIG. 3C. A lithography process for patterning the oxide mask layer OM is performed. As aforementioned, a photoresist PR2 may be used. One or more etching processes are performed to pattern the oxide mask layer OM. Through the etching process, parts of the portion OM1' uncovered by the photoresist PR2 are removed, and the underlying top electrode layer 190 in the cell region CR is exposed. In the present embodiments, due to the thickness difference between the portions OM1' and OM2 of the oxide mask layer OM (referring to FIG. 3B), the etching process may be controlled such that while parts of the portion OM1' uncovered by the photoresist PR2 are removed, an extending part EP of the portion OM2 uncovered by the photoresist PR2 is thinned and remains over the dummy cell region DCR, the peripheral region RR, the logic region LR.

Figure 3D:
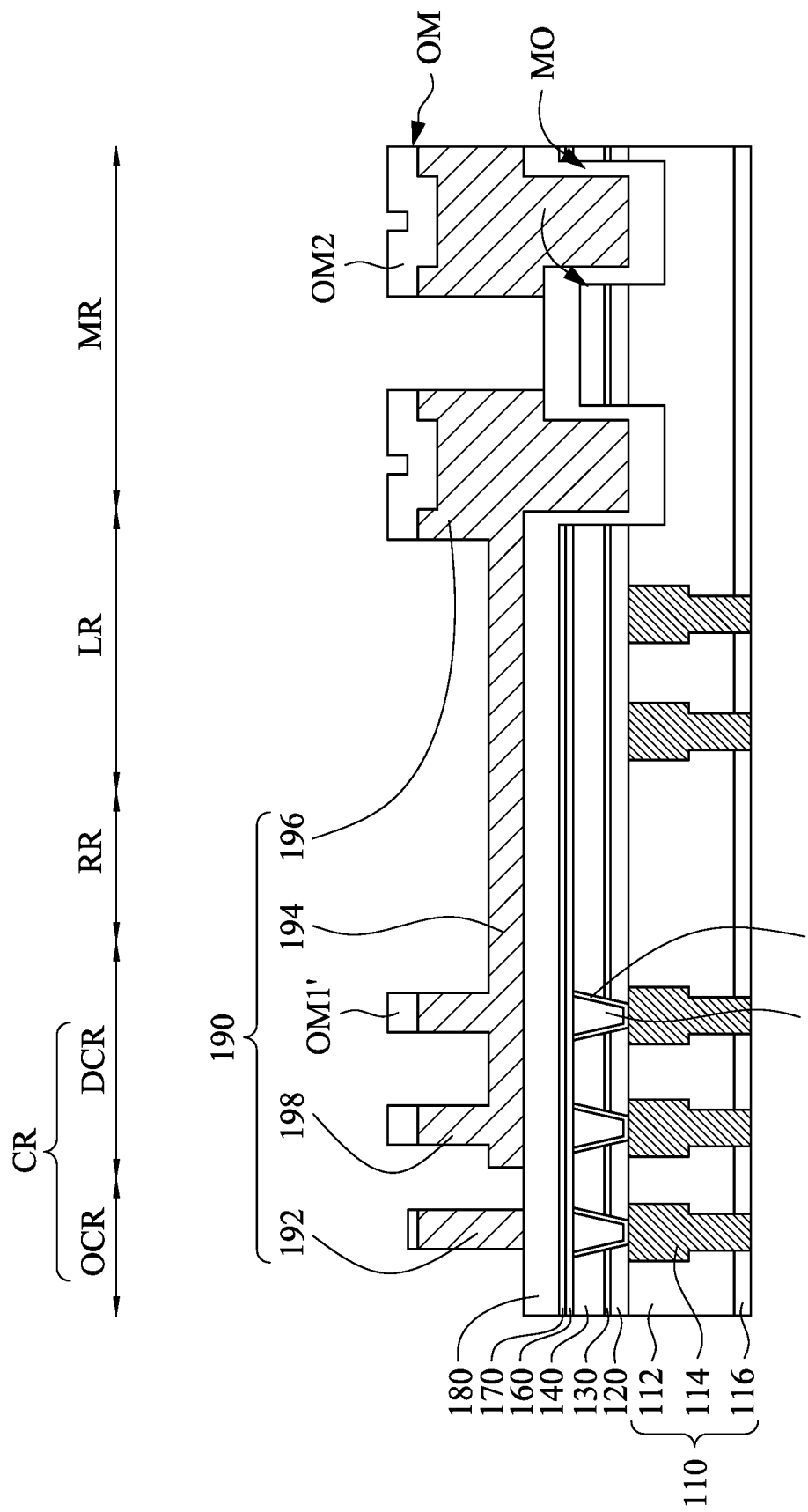

Reference is made to FIG. 3D. The top electrode layer 190 (referring to FIG. 3C) is etched to form at least one top electrode 192 in the operable cell region OCR, at least one dummy top electrode 198 in the dummy cell region DCR, and at least one top electrode 196 in the mark region MR. The patterned oxide mask layer OM may be used as mask in the etching process. Due to the presence of the extending part EP in the regions DCR, RR, and LR (referring to FIG. 3C), when parts of the top electrode layer 190 (referring to FIG. 3C) in the operable cell region OCR is etched to expose the underlying resistance switching layer 180, the top electrode layer 190 has an extending portion 194 over the regions DCR, RR, and LR. In the present embodiments, the extending portion 194 may connect the dummy top electrodes 198.

Figure 3E:
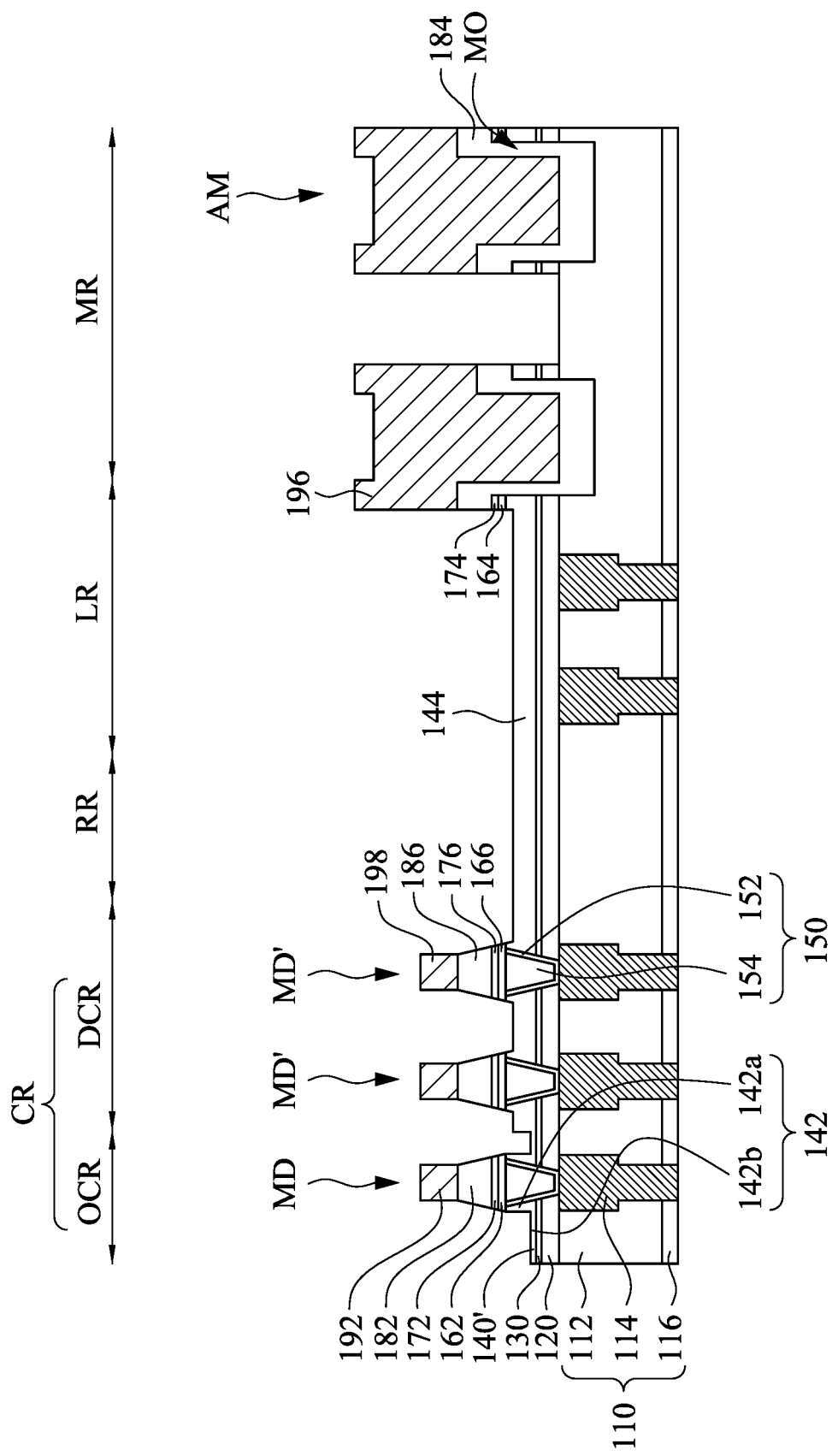

Reference is made to FIG. 3E. The resistance switching layer 180, the buffer layer 170, the bottom electrode layer 160, and the dielectric layer 140 (referring to FIG. 3D) are etched to form resistance switching element 182-186, at least one buffers 172, 176 and buffer residues 174, at least one bottom electrodes 162, 166. and bottom electrode residues 164, and a dielectric layer 140'. The etching process may include a dry etch, a wet etch, or a combination of dry etch and wet etch. Through the etching process, the dielectric layer 140 has a portion 142 in the operable cell region OCR and an extending portion 144 in the dummy cell region DCR, the peripheral region RR, and the logic region LR after the etching process. For example, the portion 144 is thicker than a bottom part 142a of the portion 142. In some embodiments, the dielectric layer 140 under the extending portion 194 (referring to FIG. 3D) may also be etched, such that a top surface of the portion 144 is at a position lower than that of the side part 142b of the portion 142. In some embodiments, the dielectric layer 140 under the extending portion 194 (referring to FIG. 3D) is not etched, such that the top surface of the portion 144 is at a position level with that of the side part 142b of the portion 142 of the dielectric layer 140. After the etching process, the patterned oxide mask layer OM' may be removed, and the height of the top electrodes 192 and 198 may be reduced.

In some embodiments, the memory device MD is formed in the operable cell region OCR, and dummy memory devices MD' are formed in the dummy cell region DCR. For example, the memory device MD includes the top electrode 192, the resistance switching element 182, the buffer 172, the bottom electrode 162, and the BEVA 150 in the operable cell region OCR. Each of the dummy memory device MD' may include the top electrode 198, the resistance switching element 186, the buffer 176, the bottom electrode 166, and the BEVA 150 in the dummy cell region DCR. In some embodiments, as mentioned previously, the BEVA 150 of the dummy memory device MD' may be omitted. In some embodiments, portions of the metallization pattern 114 under the dummy memory device MD' may be omitted. In some embodiments, alignment marks AM are formed in the mark region MR. For example, each of the alignment marks AM includes the top electrode 196, the resistance switching element 184, and the opening MO.

Figure 3F:
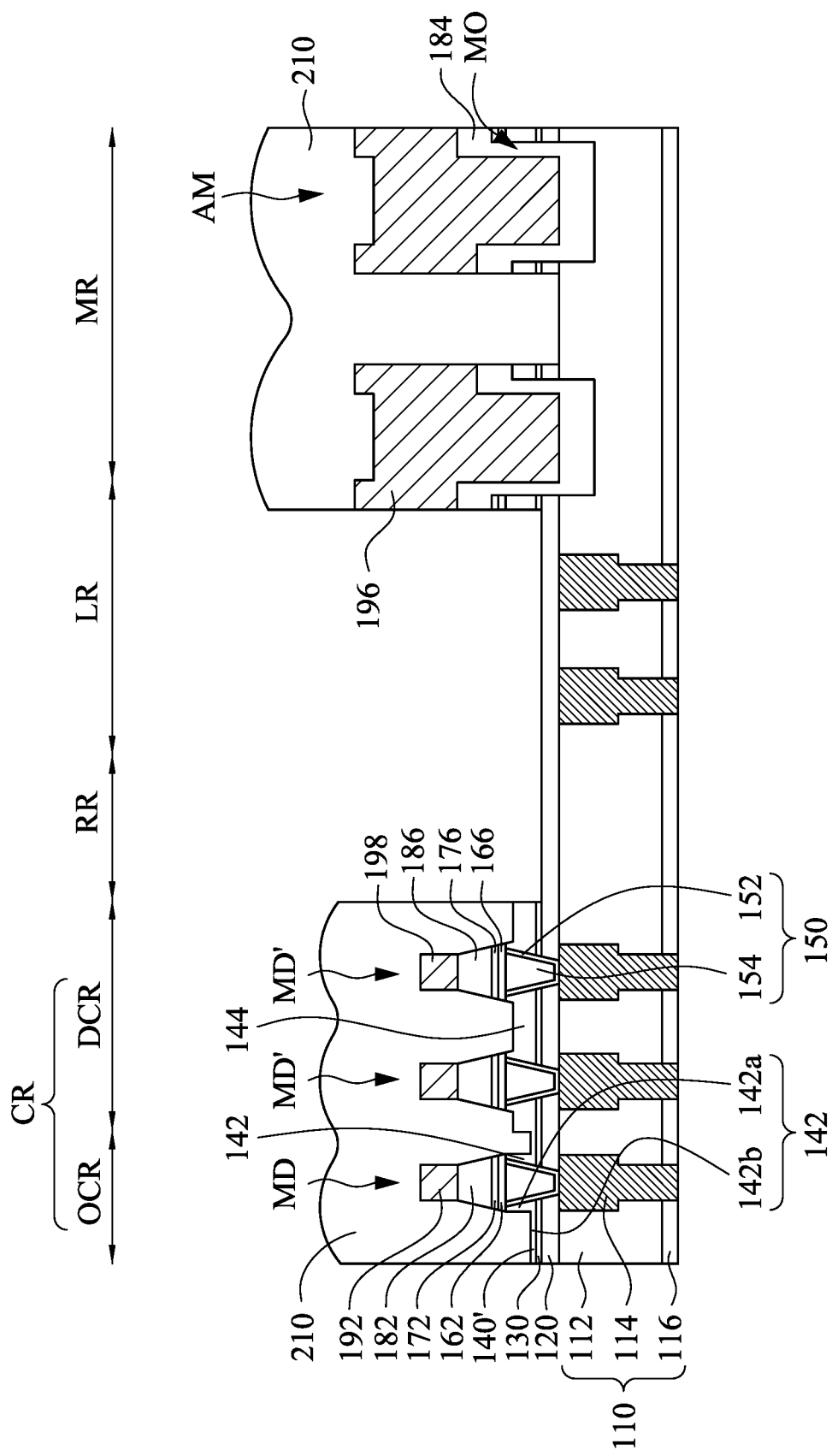

Reference is made to FIG. 3F. An ILD layer 210 is formed over the structure of FIG. 3E, and a first etch process is performed to remove the dielectric layers in the peripheral region RR, the logic region LR, and the mark region MR, and a second etch process is performed to remove the protective layer 130 in the peripheral region RR and the logic region LR, as illustrated in FIG. 1J. In some embodiments, the protective layer 130 may has a higher etch resistance to the first etch process than that of the ILD layer 210 and the dielectric layer 140', such that the first etch process may stop at the protective layer 130 and not damage the underlying etch stop layer 120. In some embodiments, the etch stop layer 120 may has a higher etch resistance to the second etch process than that of the protective layer 130, such that the second etch process may stop at the etch stop layer 120 and not damage the underlying metallization pattern 114. After the removal, the protective layer 130 is not in the peripheral region RR and the logic region LR.

Figure 3G:
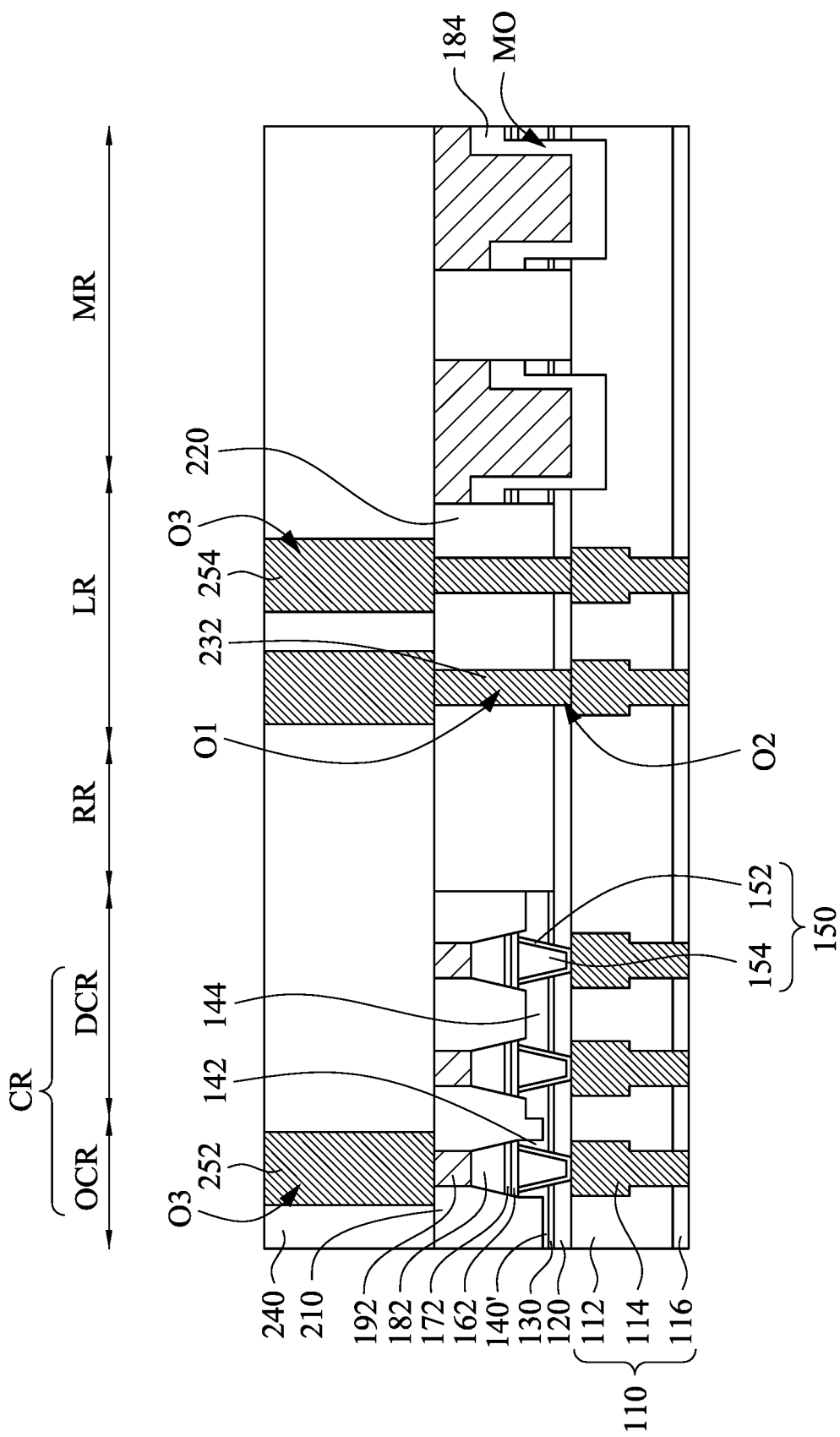

Reference is made to FIG. 3G. An ILD layer 220 is formed over the logic region LR and the peripheral region RR of the structure of FIG. 1J, and then a metallization pattern 232 is formed in the ILD layer 220 and connected to the metallization pattern 114 in the logic region. The metallization pattern 232 may be plural metal vias. Subsequently, an ILD layer 240 is formed thereon, and then metallization patterns 252 and 254 is formed in the ILD layer 220. The metallization patterns 252 and 254 are connected to memory device MD in the operable cell region OCR and the metallization pattern 232 in the logic region LR. For example, the formation of the metallization patterns 252 and 254 may include etching openings O3 in the ILD layer 240, overfilling the openings O3 with a metal material, and removing an excess portion of the metal material outside the openings O3 of the ILD layer 240. The metallization pattern 252 and 254 may not be connected to dummy memory devices MD' in the dummy cell region DCR. Other details of the present embodiments are similar to those aforementioned and not repeated herein.

Figure 4:
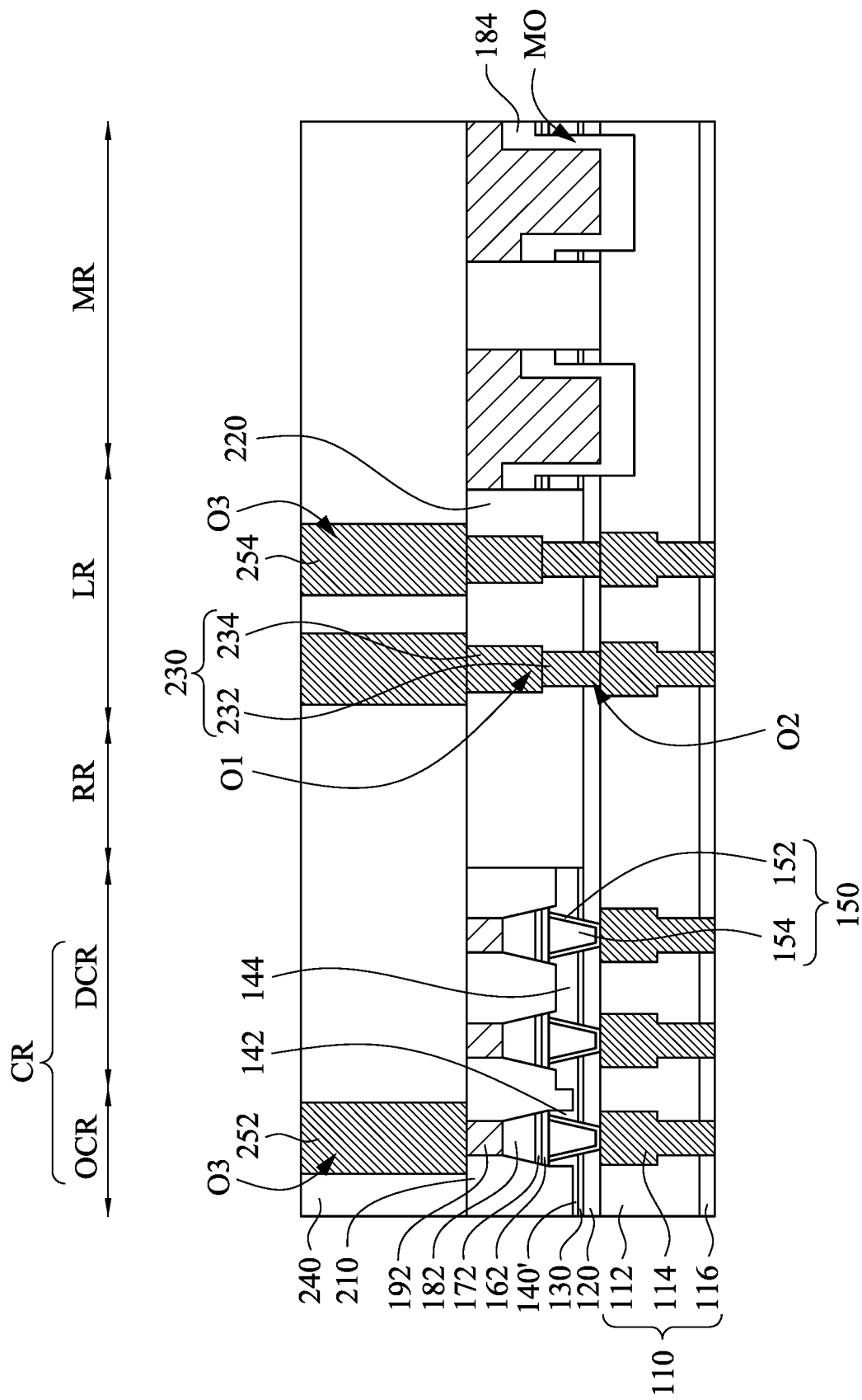
FIG. 4 is a cross-sectional view of an integrated circuit according to various embodiments of the present disclosure.

FIG. 4 is a cross-sectional view of an integrated circuit according to various embodiments of the present disclosure. The present embodiments are similar to those of FIG. 3G, and the difference between the present embodiments and the embodiments of FIG. 3G is that a metallization pattern 230 including metal vias 232 and metal lines 234 is formed in the ILD layer 220 before the formation of the ILD 240 and the metallization patterns 252 and 254. In some examples, a height of the metallization pattern 230 may be equal to a height of the memory device MD. The metallization pattern 230 serves a $M_x$ metal layer, the metallization pattern 114 serves a $M_{x-1}$ metal layer, and the metallization pattern 254 serves a $M_{x+1}$ metal layer.

FIGS. 5A-5H are cross-sectional views of an integrated circuit at various intermediate stages of manufacture according to various embodiments of the present disclosure. The embodiments of FIGS. 5A-5H are similar to that of FIGS. 1A-1K, and at least one difference between the embodiments of FIGS. 5A-5H and the embodiments of FIGS. 1A-1K is that deeper recesses are formed in the peripheral region RR. The illustration is merely exemplary and is not intended to be limiting beyond what is specifically recited in the claims that follow. It is understood that additional operations may be provided before, during, and after the operations shown by FIGS. 5A-5H, and some of the operations described below can be replaced or eliminated for additional embodiments of the method. The order of the operations/processes may be interchangeable.

Figure 5A:
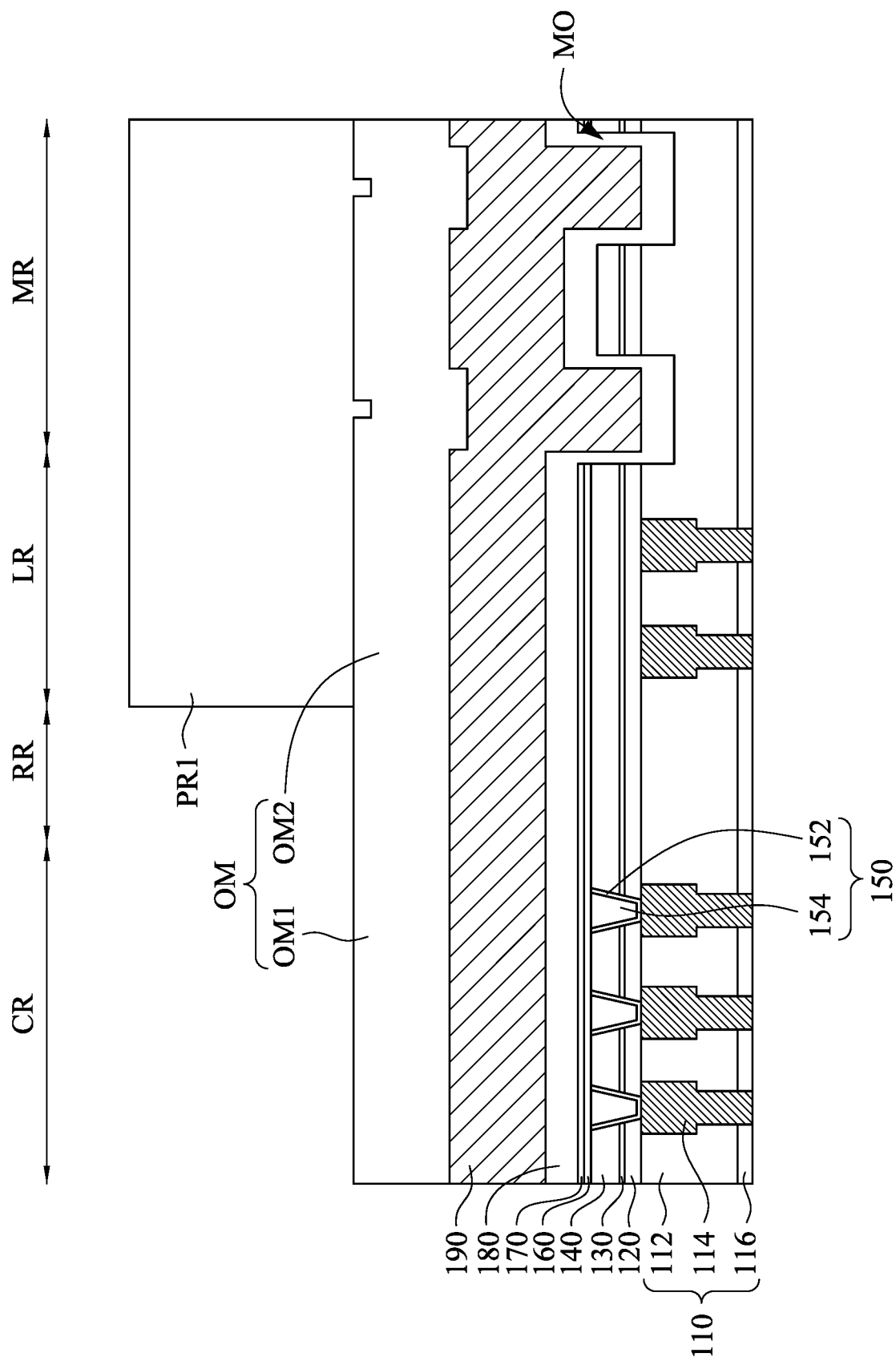
FIGS. 5A-5H are cross-sectional views of an integrated circuit at various intermediate stages of manufacture according to various embodiments of the present disclosure.

FIG. 5A illustrates a substrate having a metal/dielectric layers 110 and plural layers thereon. The substrate having the metal/dielectric layers 110 has a logic region LR, a peripheral region RR, a cell region CR, and a mark region MR. The peripheral region RR is free of the metallization pattern 114. As aforementioned, the etch stop layer 120, the protective layer 130, the dielectric layer 140, the BEVAs 150, the blanket bottom electrode layer 160, the buffer layer 170, the resistance switching layer 180, the top electrode layer 190, the oxide mask layer OM, and the resist mask PR are formed over the metal/dielectric layers 110. In the present embodiments, the resist mask PR1 covers the logic region LR and the mark region MR, but exposes the cell region CR and the peripheral region RR. The oxide mask layer OM has a portion OM1 uncovered by the resist mask PR1 and a portion OM2 covered by the resist mask PR1. Other details of the present embodiments are similar to those aforementioned, and not repeated herein.

Figure 5B:
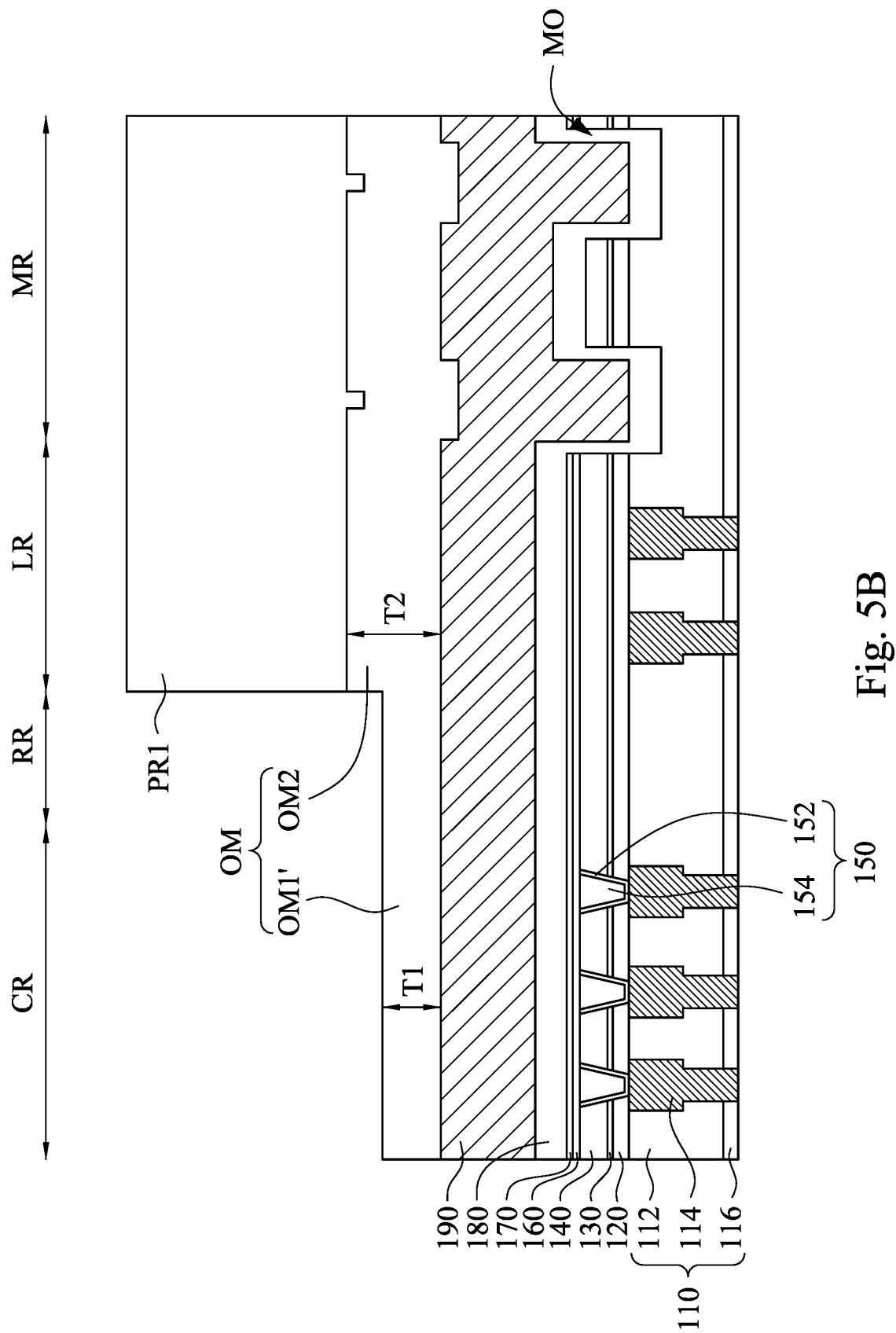

Reference is made to FIG. 5B. A portion OM1 of the oxide mask layer OM exposed by the resist mask PR1 is thinned by an etching process. The etching process is performed to remove an upper part of the portion OM1 of the oxide mask layer OM, and the etching process stops before removing a lower part of the portion OM1. After the etching process, the remaining lower part of the portion OM1 is referred to as the portion OM1'. A thickness T1 of the portion OM1' is less than a thickness T2 of a portion OM2 of the oxide mask layer OM covered by the resist mask PR1. After the etching process, the resist mask PR1 may be removed using, for example, an ash process, after the etching process.

Figure 5C:
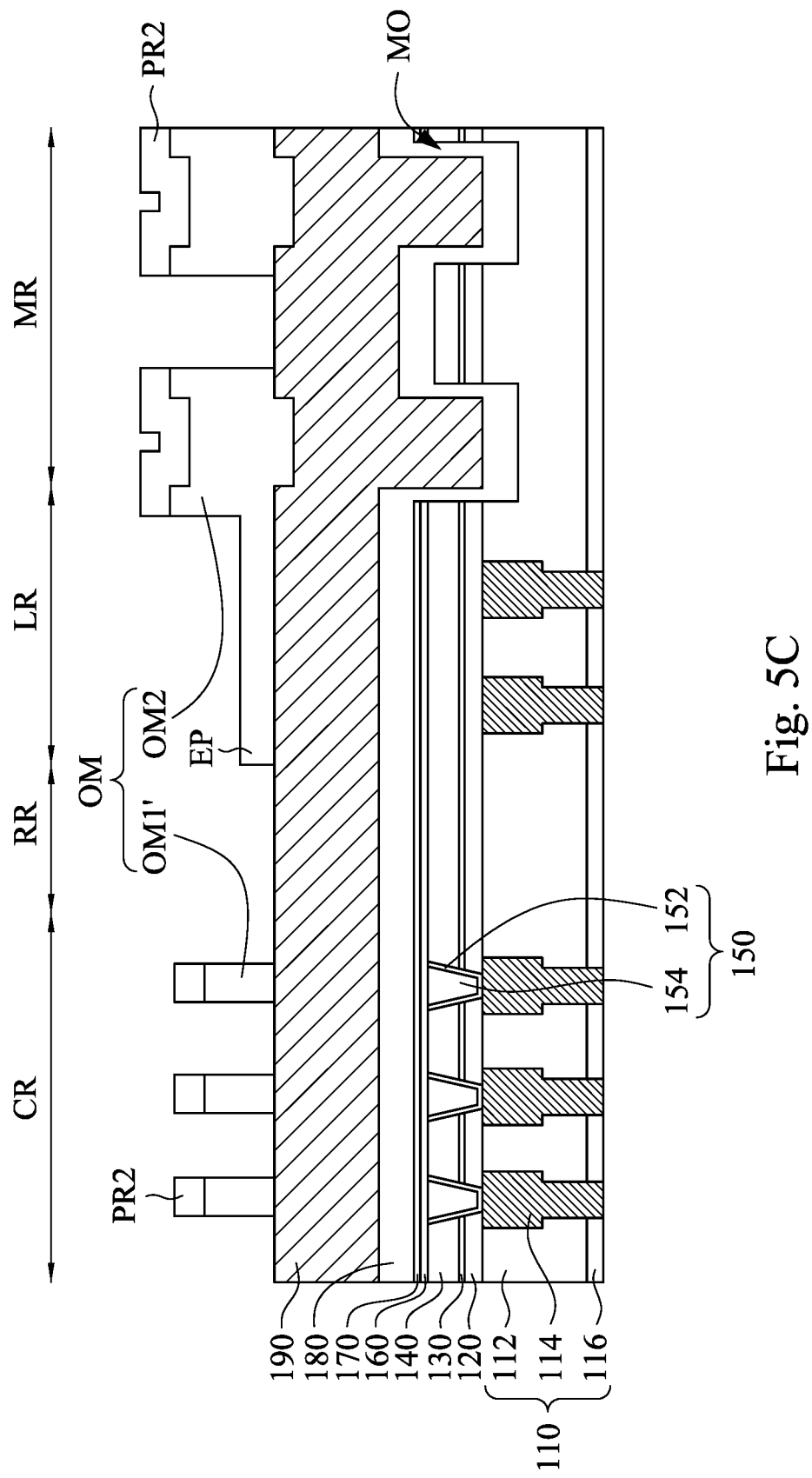

Reference is made to FIG. 5C. A lithography process for patterning the oxide mask layer OM is performed. As aforementioned, a photoresist PR2 may be used. One or more etching processes are performed to pattern the oxide mask layer OM. Through the etching process, parts of the portion OM1' uncovered by the photoresist PR2 are removed, and the underlying top electrode layer 190 in the cell region CR is exposed. In the present embodiments, due to the thickness difference between the portions OM1' and OM2 of the oxide mask layer OM, the etching process may be controlled such that while parts of the portion OM1' uncovered by the photoresist PR2 are removed, an extending part EP of the portion OM2 uncovered by the photoresist PR2 is thinned and remains over the logic region LR.

Figure 5D:
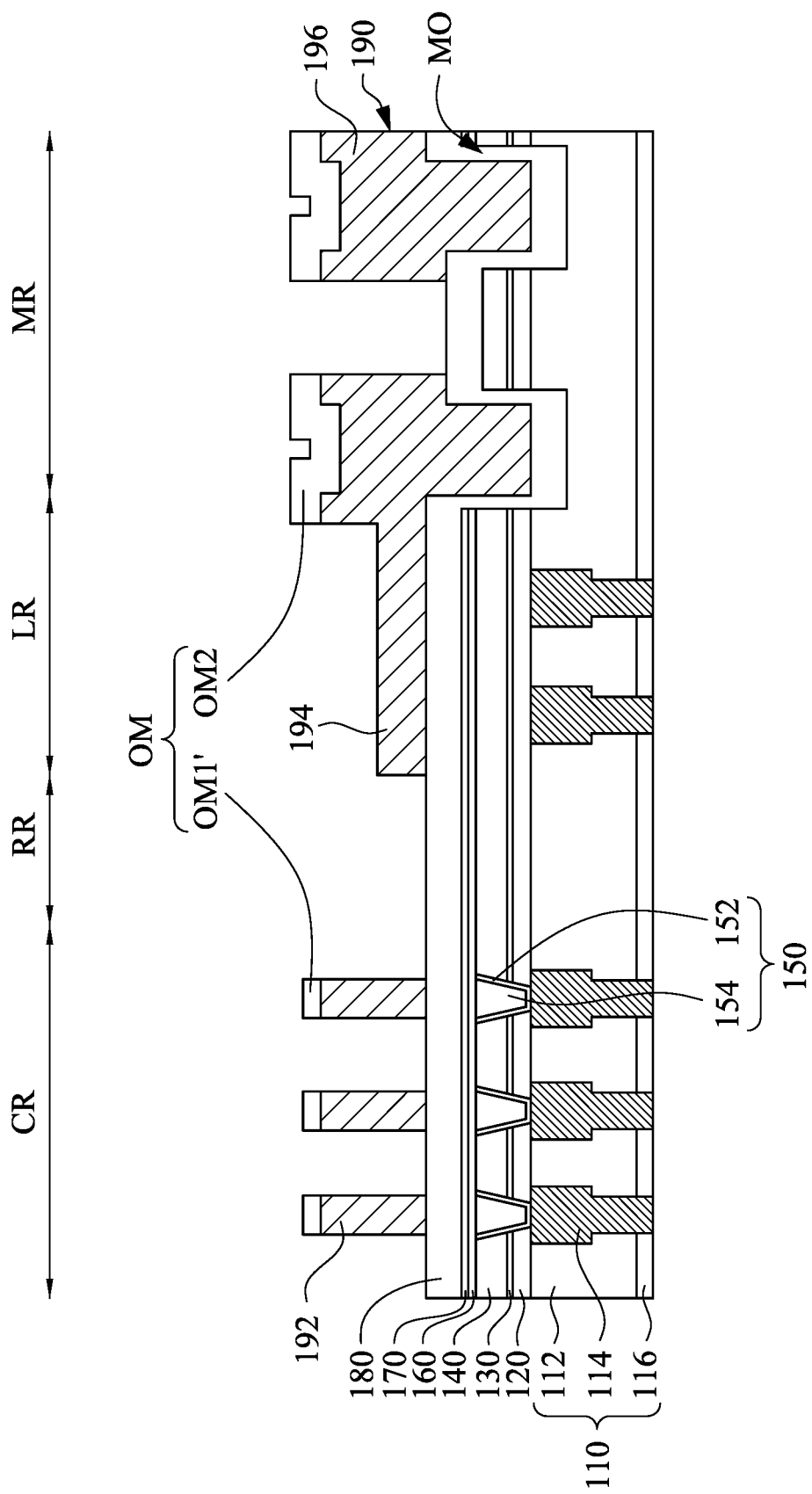

Reference is made to FIG. 5D. The top electrode layer 190 (referring to FIG. 5C) is etched to form at least one top electrode 192 in the cell region CR and at least one top electrode 196 in the mark region MR. The patterned oxide mask layer OM may be used as mask in the etching process. Due to the presence of the extending part EP in the region LR (referring to FIG. 5C), when parts of the top electrode layer 190 (referring to FIG. 5C) in the cell region CR and the peripheral region RR are etched and exposing the underlying resistance switching layer 180, the top electrode layer 190 has an extending portion 194 over the region LR.

Figure 5E:
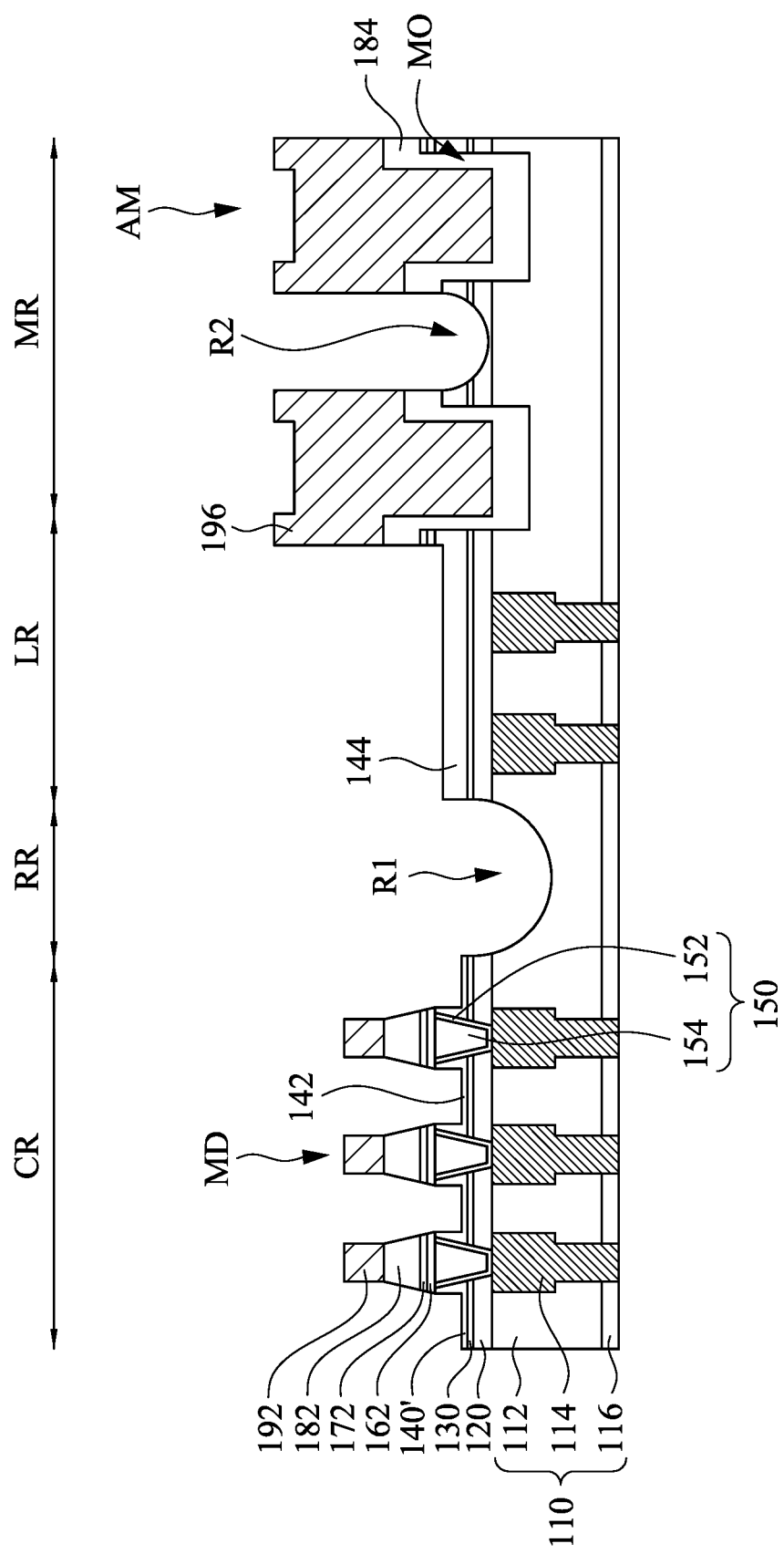

Reference is made to FIG. 5E. The resistance switching layer 180, the buffer layer 170, the bottom electrode layer 160, and the dielectric layer 140 (referring to FIG. 1F) are etched to form resistance switching element 182 and 184, at least one buffer 172, at least one bottom electrode 162, and a dielectric layer 140'. The etching process may include a dry etch, a wet etch, or a combination of dry etch and wet etch. Through the configuration, the dielectric layer 140 has a portion 142 in the cell region CR and an extending portion 144 in the logic region LR after the etching process. For example, the portion 144 is thicker than a bottom part 142a of the portion 142.

In some embodiments, without the protection of the extending portion 194 (referring to FIG. 5D), during the etching processes in forming the memory device MD and the directional etching process, the layers 120-140 in the region RR may be punched through, and exposing the underlying metal/dielectric layers 110. For example, the layer 120-140 may be further etched, such that a recess R1 may penetrate the layers 120-140 in the peripheral region RR and further be formed into the ILD layer 112 and. Similarly, in some embodiments, a recess R2 may be formed in the layers 120-140 in the mark region MR. Since the regions RR and MR are free of the metallization pattern 114, the recesses R1 and R2 would not damage the circuit. The recesses R1 and R2 may have a curve front. After the etching process, the patterned oxide mask layer OM' may be removed, and the height of the top electrodes 192 may be reduced.

Figure 5F:
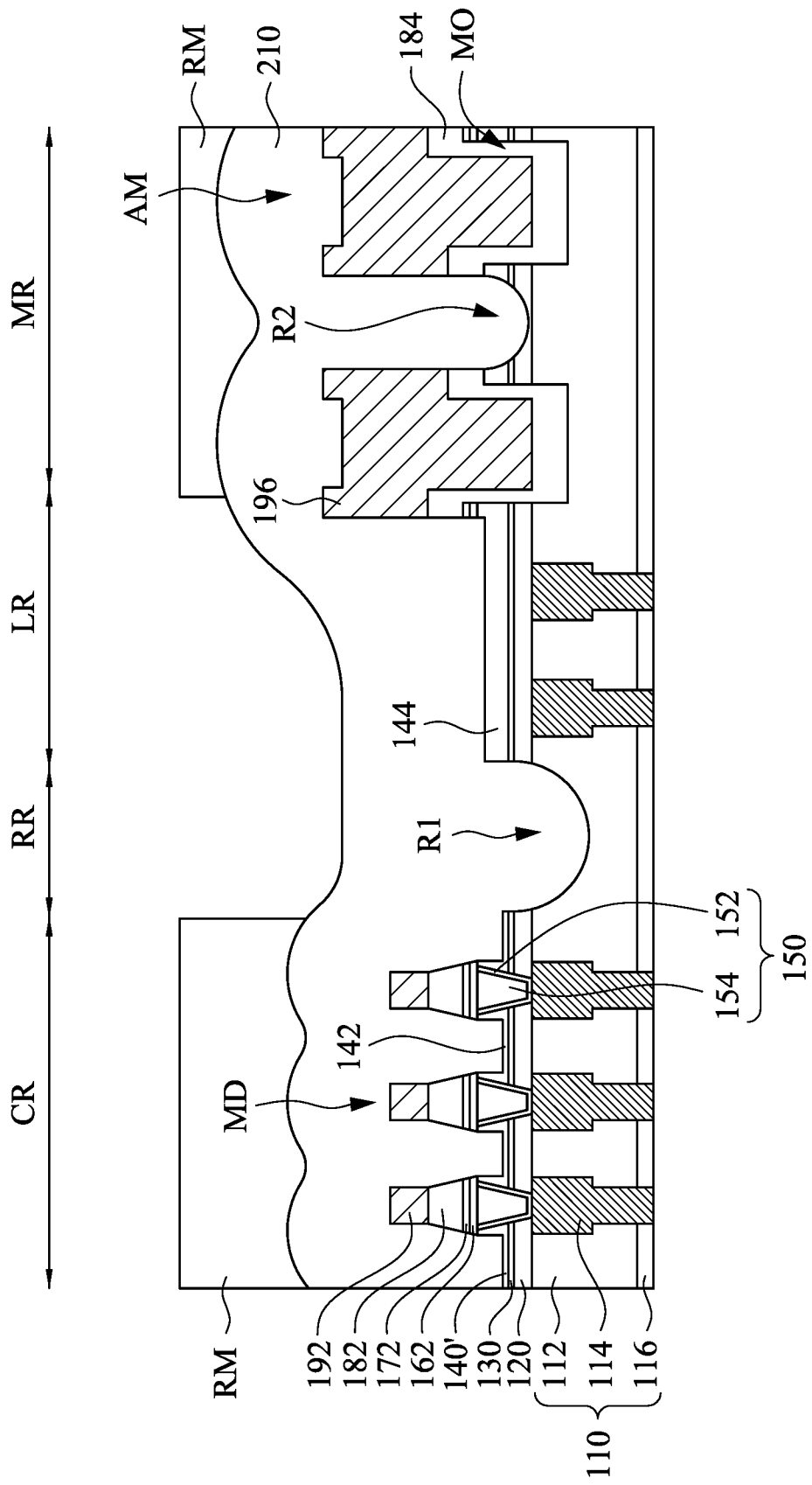

Reference is made to FIG. 5F. An ILD layer 210 is formed over the structure of FIG. 5E. The ILD layer 210 may have a material the same as or different than that the ILD layer 112. The material of the ILD layer 210 are similar to those aforementioned, and not repeated herein. The ILD layer 210 may fills the recesses R1 and R2. Subsequently, a resist mask RM may be formed over the ILD layer 112. The resist mask RM is forming by patterning a resist layer (e.g., a photoresist layer) using a suitable photolithography process. The resist mask RM covers the regions CR and MR and exposes the regions RR and LR.

Figure 5G:
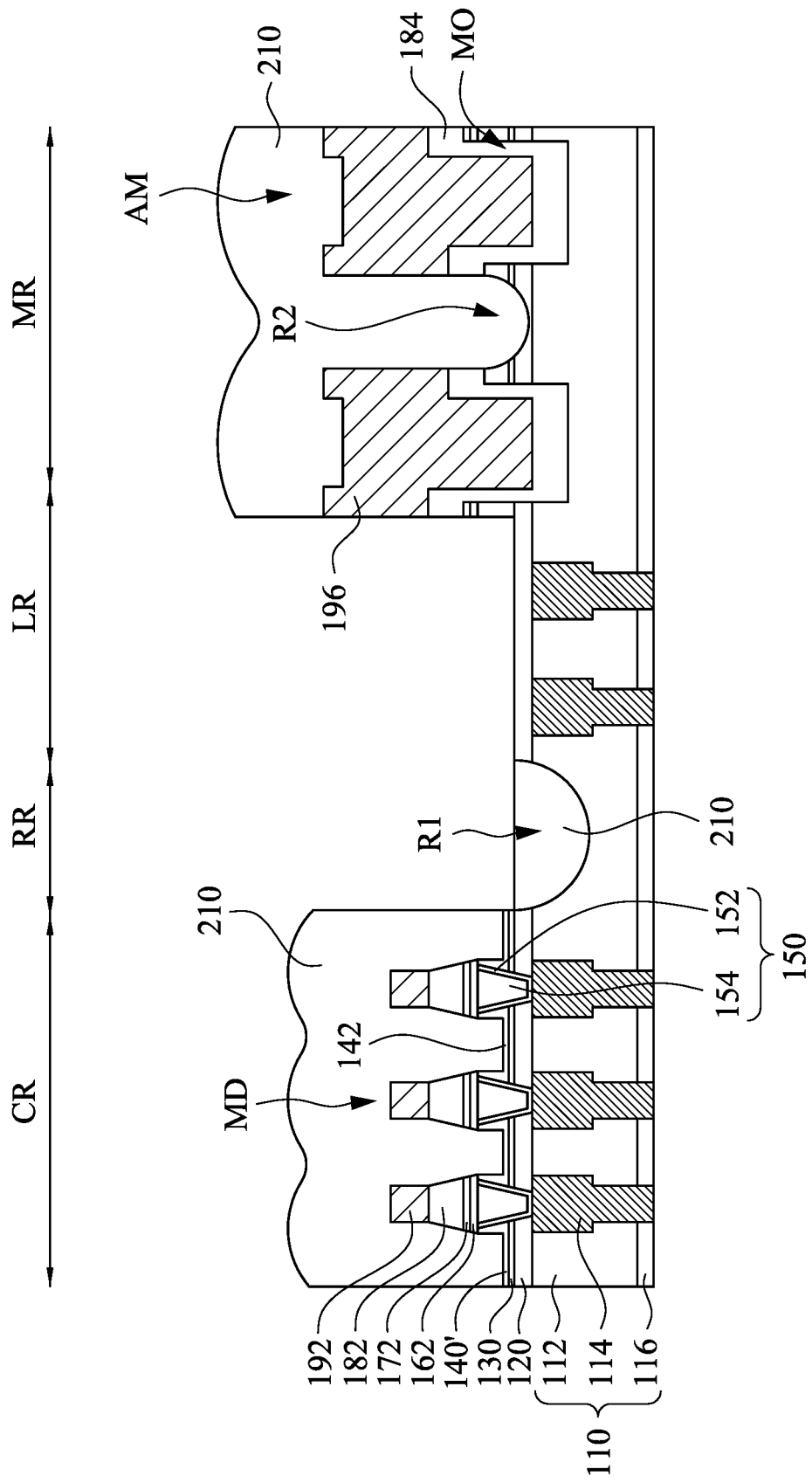

Reference is made to FIG. 5G. Etching processes are performed to remove the dielectric layers and the protective layer 130 underlying the dielectric layers in the peripheral region RR and the logic region LR, as illustrated in FIG. 1J. For example, a first etch process is performed to remove the dielectric portion 144 of the dielectric layer 140' and the ILD layer 210 in the regions RR and LR, and the protective layer 130 may has a higher etch resistance to the first etch process than that of the ILD layer 210 and the dielectric layer 140', such that the first etch process may stop at the protective layer 130 and not damage the underlying etch stop layer 120. A second etch process is performed to remove the protective layer 130 in the peripheral region RR and the logic region LR, and the etch stop layer 120 may has a higher etch resistance to the second etch process than that of the protective layer 130, such that the second etch process may stop at the etch stop layer 120 and not damage the underlying metallization pattern 114. After the etching process, a portion of the ILD layer 210 is in the recess R1. Other detail of the etching processes are similar to those aforementioned, and not repeated herein.

Figure 5H:
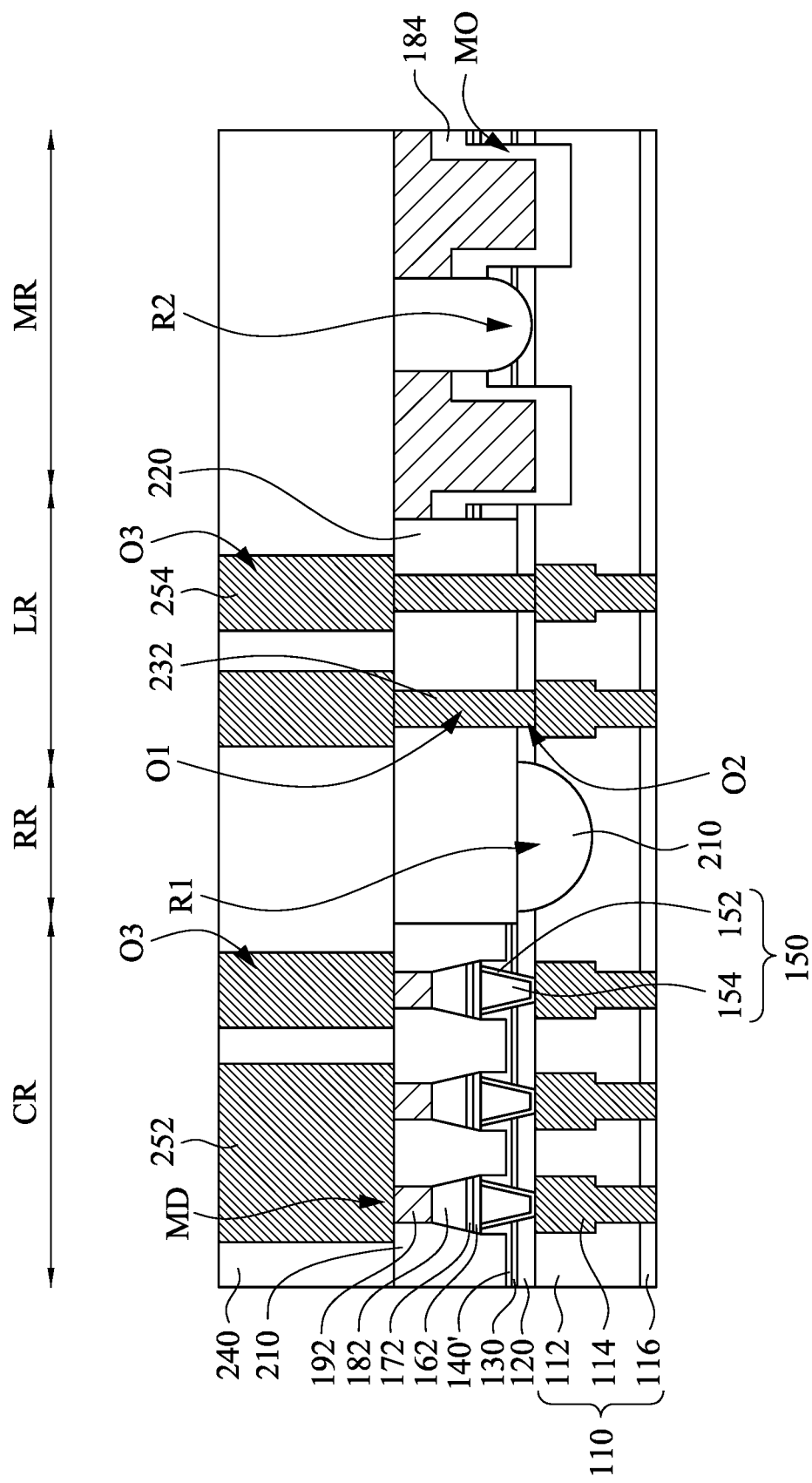

Reference is made to FIG. 5H. An ILD layer 220 is formed over the logic region LR and the peripheral region RR of the structure of FIG. 5G. Then, a metallization pattern 232 is formed in the ILD layer 220 and connected to the metallization pattern 114 in the logic region LR. The metallization pattern 232 may be plural metal vias. Subsequently, an ILD layer 240 is formed over thereon, and then metallization patterns 252 and 254 is formed in the ILD layer 220. The metallization patterns 252 and 254 are connected to memory device MD in the cell region CR and the metallization pattern 232 in the logic region LR respectively. Other details of the present embodiments are similar to those aforementioned and not repeated herein.

Figure 6:
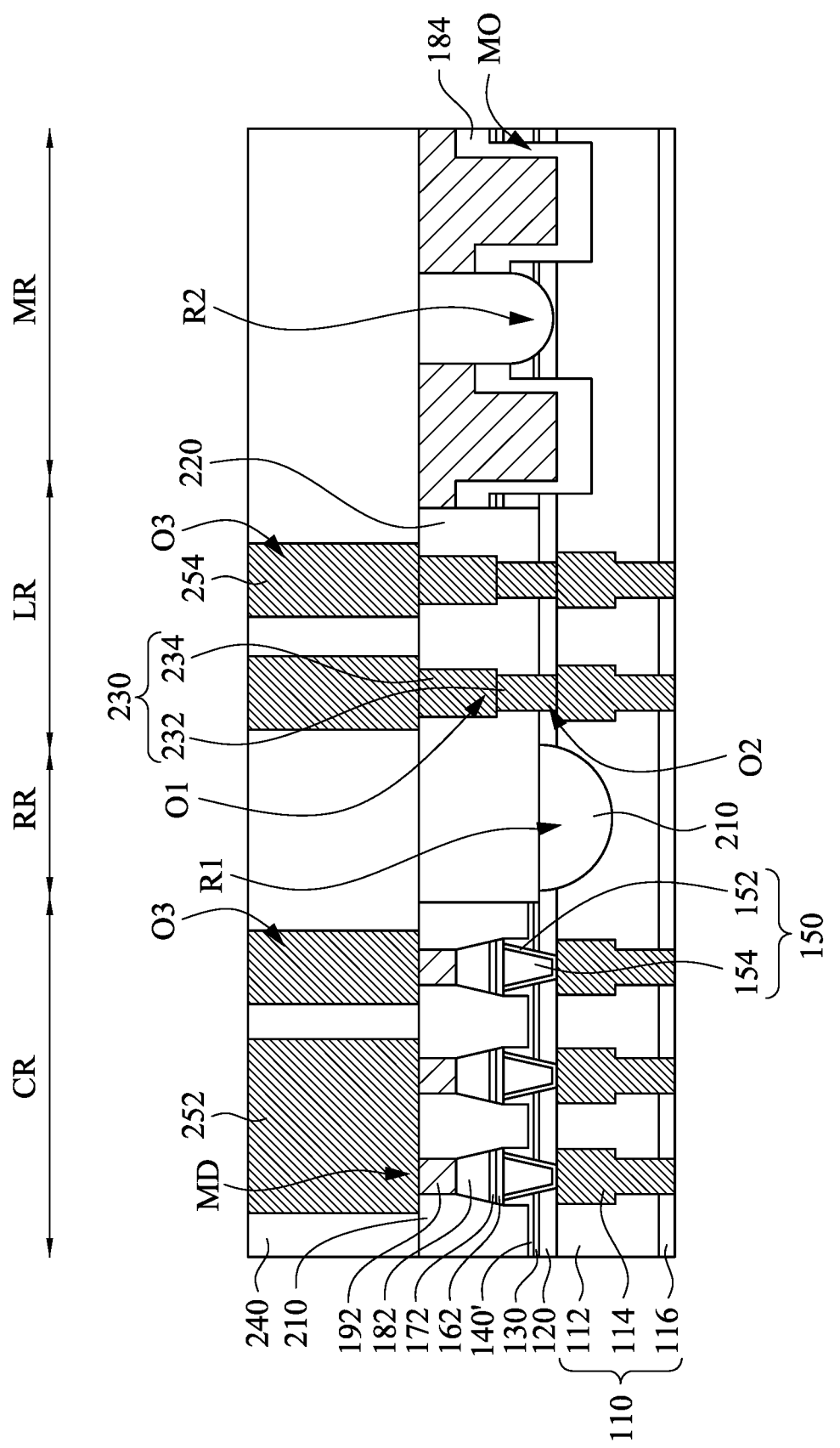
FIG. 6 is a cross-sectional view of an integrated circuit according to various embodiments of the present disclosure.

FIG. 6 is a cross-sectional view of an integrated circuit according to various embodiments of the present disclosure. The present embodiments are similar to those of FIG. 5H, and the difference between the present embodiments and the embodiments of FIG. 5H is that a metallization pattern 230 including metal vias 232 and metal lines 234 is formed in the ILD layer 220 before the formation of the ILD 240 and the metallization patterns 252 and 254. In some examples, a height of the metallization pattern 230 may be equal to a height of the memory device MD. The metallization pattern 230 serves a $M_x$ metal layer, the metallization pattern 114 serves a $M_{x-1}$ metal layer, and the metallization pattern 254 serves a $M_{x+1}$ metal layer.

FIGS. 7A-7H are cross-sectional views of an integrated circuit at various intermediate stages of manufacture according to various embodiments of the present disclosure. The embodiments of FIGS. 7A-7H are similar to that of FIGS. 5A-5H, and at least one difference between the embodiments of FIGS. 7A-7H and the embodiments of FIGS. 5A-5H is that a resistor 400 is formed in the peripheral region RR. The illustration is merely exemplary and is not intended to be limiting beyond what is specifically recited in the claims that follow. It is understood that additional operations may be provided before, during, and after the operations shown by FIGS. 5A-5H, and some of the operations described below can be replaced or eliminated for additional embodiments of the method. The order of the operations/processes may be interchangeable.

Figure 7A:
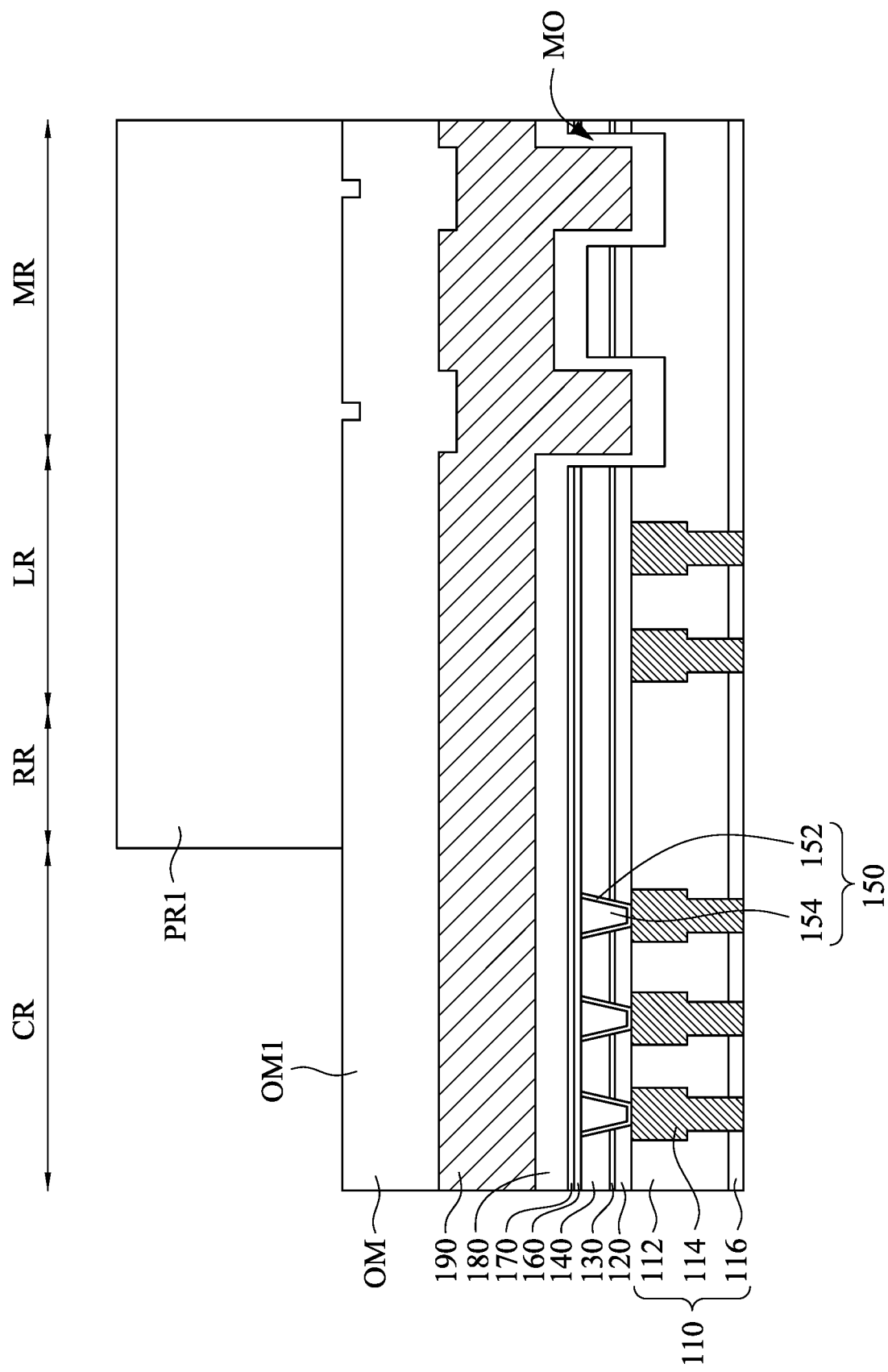
FIGS. 7A-7H are cross-sectional views of an integrated circuit at various intermediate stages of manufacture according to various embodiments of the present disclosure.

Referring to FIG. 7A, as aforementioned, the etch stop layer 120, the protective layer 130, the dielectric layer 140, the BEVAs 150, the blanket bottom electrode layer 160, the buffer layer 170, the resistance switching layer 180, the top electrode layer 190, the oxide mask layer OM, and the resist mask PR1 are formed over the metal/dielectric layers 110. In the present embodiments, the resist mask PR1 covers the oxide mask layer OM in the regions RR, LR and MR, but exposes a portion OM1 of the oxide mask layer OM in the cell region CR. Other details of the present embodiments are similar to those aforementioned, and not repeated herein.

Figure 7B:
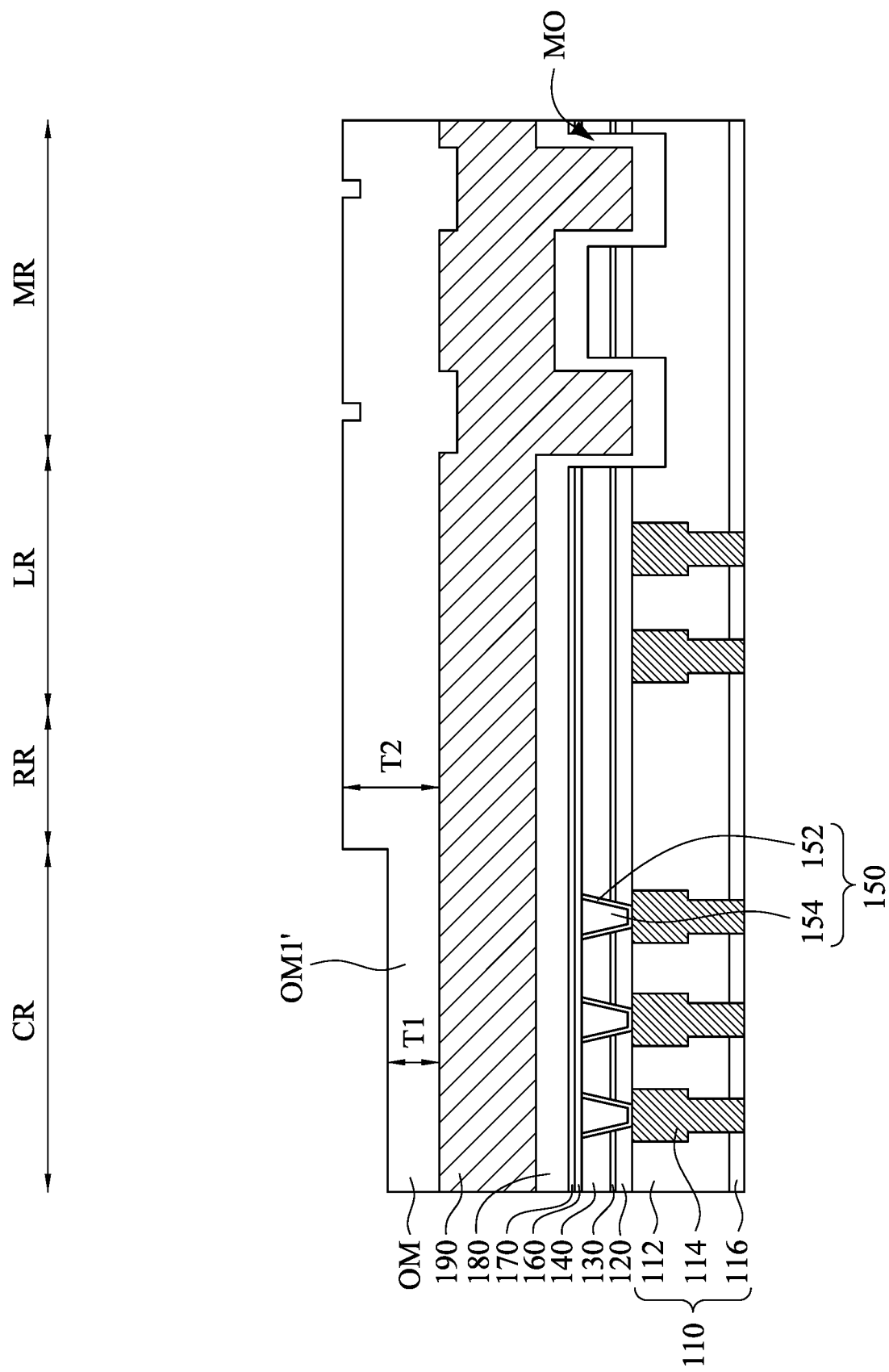

Reference is made to FIG. 7B. An etching process is performed to thin the portion OM1 of the oxide mask layer OM (referring to FIG. 7A). The etching process is performed to remove an upper part of the portion OM1 of the oxide mask layer OM, and the etching process stops before removing a lower part of the portion OM1. After the etching process, the remaining lower part of the portion OM1 is referred to as the portion OM1'. After the etching process, the resist mask PR1 may be removed using, for example, an ash process, after the etching process.

Figure 7C:
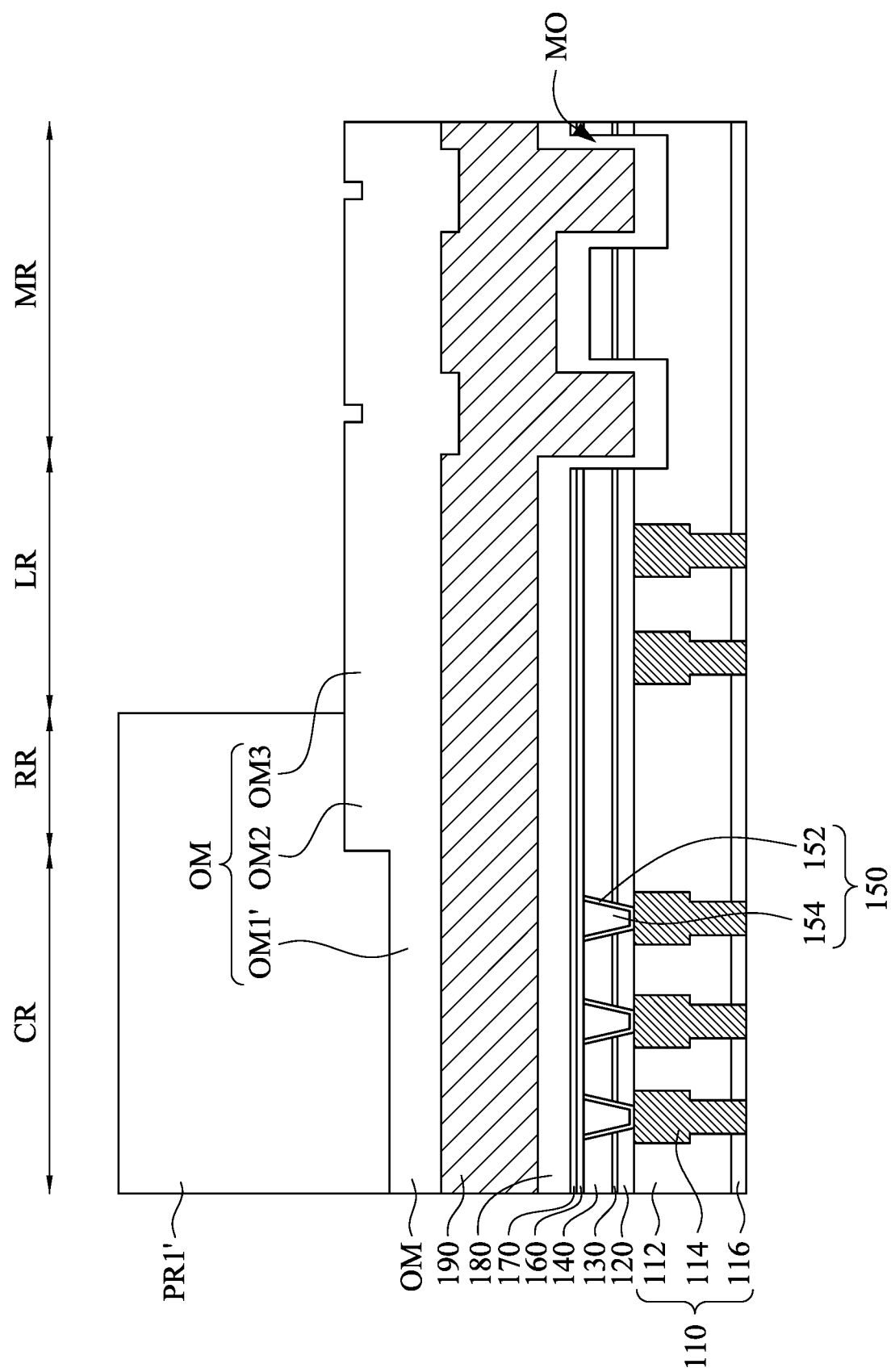

Reference is made to FIG. 7C. A resist mask PR1' is formed over the oxide mask layer OM. The material of the resist mask PR1' is similar to that of the resist mask PR1 in FIG. 7A, and not repeated herein. The resist mask PR1' covers a portion OM2 of the oxide mask layer OM in the peripheral region RR and the portion OM1 in the cell region CR, but exposes a portion OM3 of the oxide mask layer OM in the logic region LR and the mark region MR. Other details of the present embodiments are similar to those aforementioned, and not repeated herein.

Figure 7D:
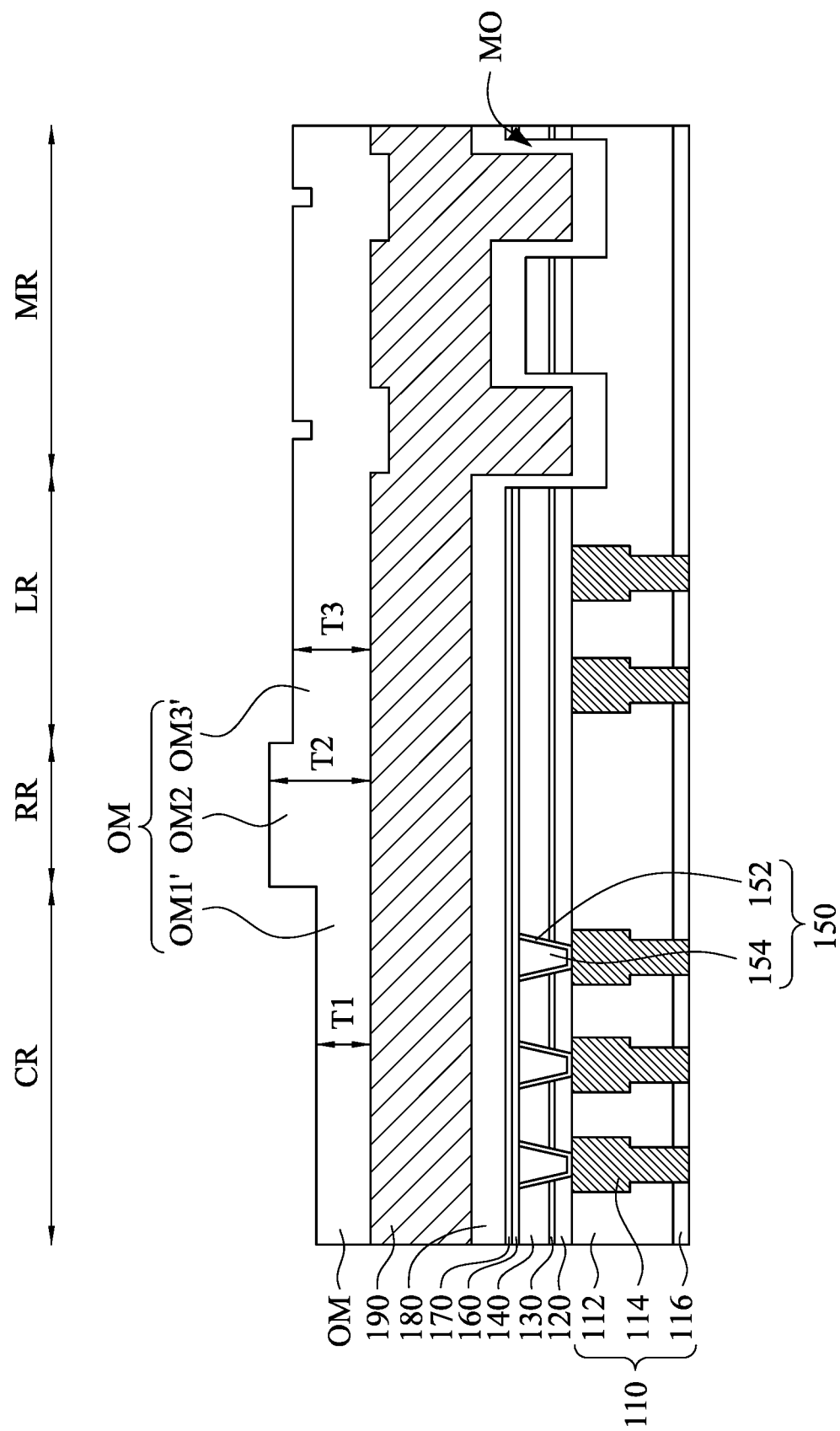

Reference is made to FIG. 7D. An etching process is performed to thin the portion OM3 of the oxide mask layer OM (referring to FIG. 7C). The etching process is performed to remove an upper part of the portion OM3 of the oxide mask layer OM, and the etching process stops before removing a lower part of the portion OM3. After the etching process, the remaining lower part of the portion OM3 is referred to as the portion OM3'. A thickness T3 of the portion OM3' is less than a thickness T2 of the portion OM2 of the oxide mask layer OM covered by the resist mask PR1', but greater than a thickness T1 of the portion OM1'. After the etching process, the resist mask PR1' may be removed using, for example, an ash process, after the etching process.

Figure 7E:
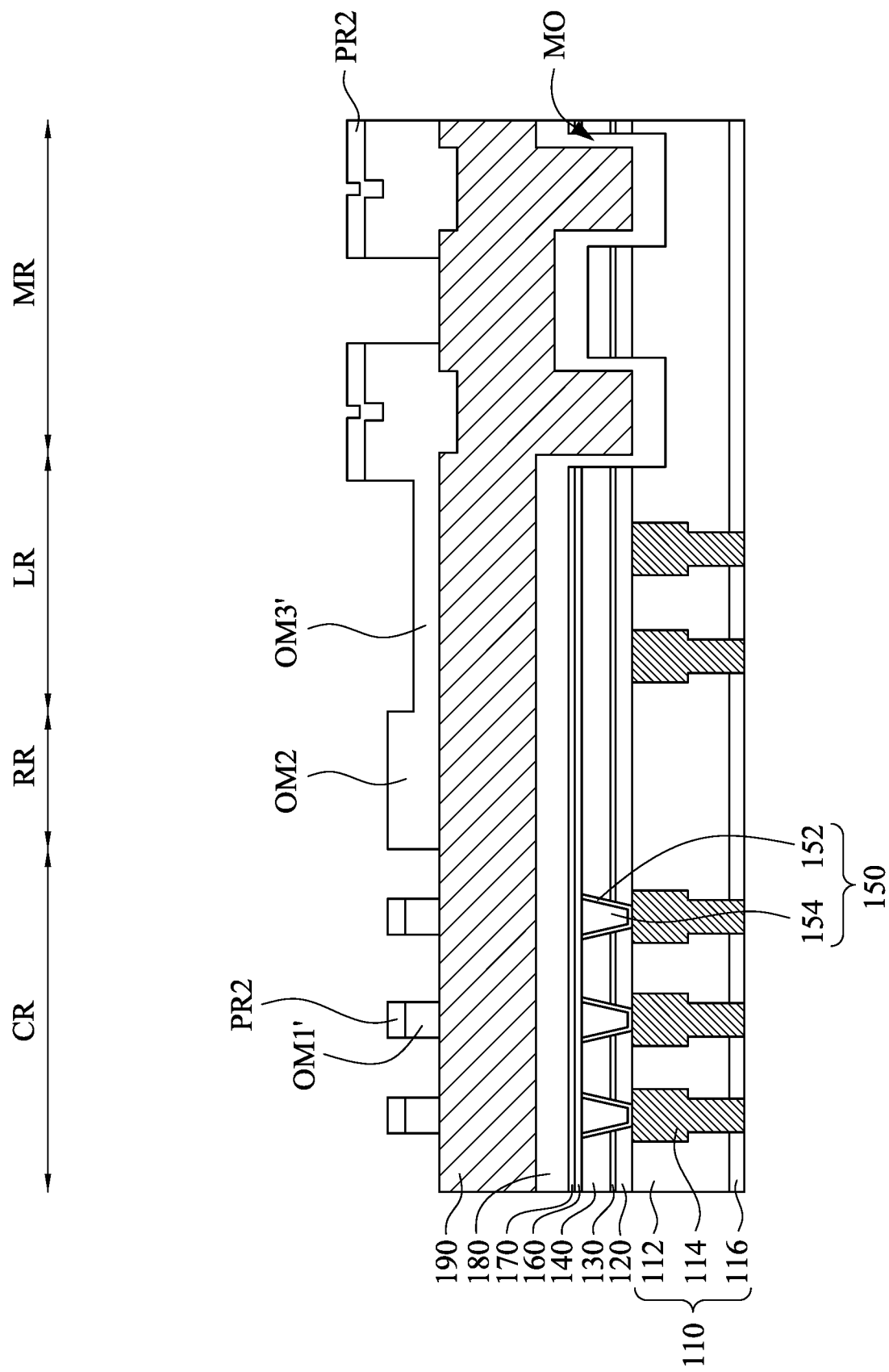

Reference is made to FIG. 7E, a lithography process for patterning the oxide mask layer OM is performed. As aforementioned, a photoresist PR2 may be used. One or more etching processes are performed to pattern the oxide mask layer OM. Through the etching process, parts of the portion OM1' uncovered by the photoresist PR2 are removed, and the underlying top electrode layer 190 in the cell region CR is exposed. In the present embodiments, due to the thickness difference between the portions OM1', OM2, and OM3' of the oxide mask layer OM (referring to FIG. 3B), the etching process may be controlled such that while parts of the portion OM1' uncovered by the photoresist PR2 are removed, the portion OM2 and an extending portion of the portion OM3' uncovered by the photoresist PR2 are thinned and remains over the peripheral region RR and the logic region LR.

Figure 7F:
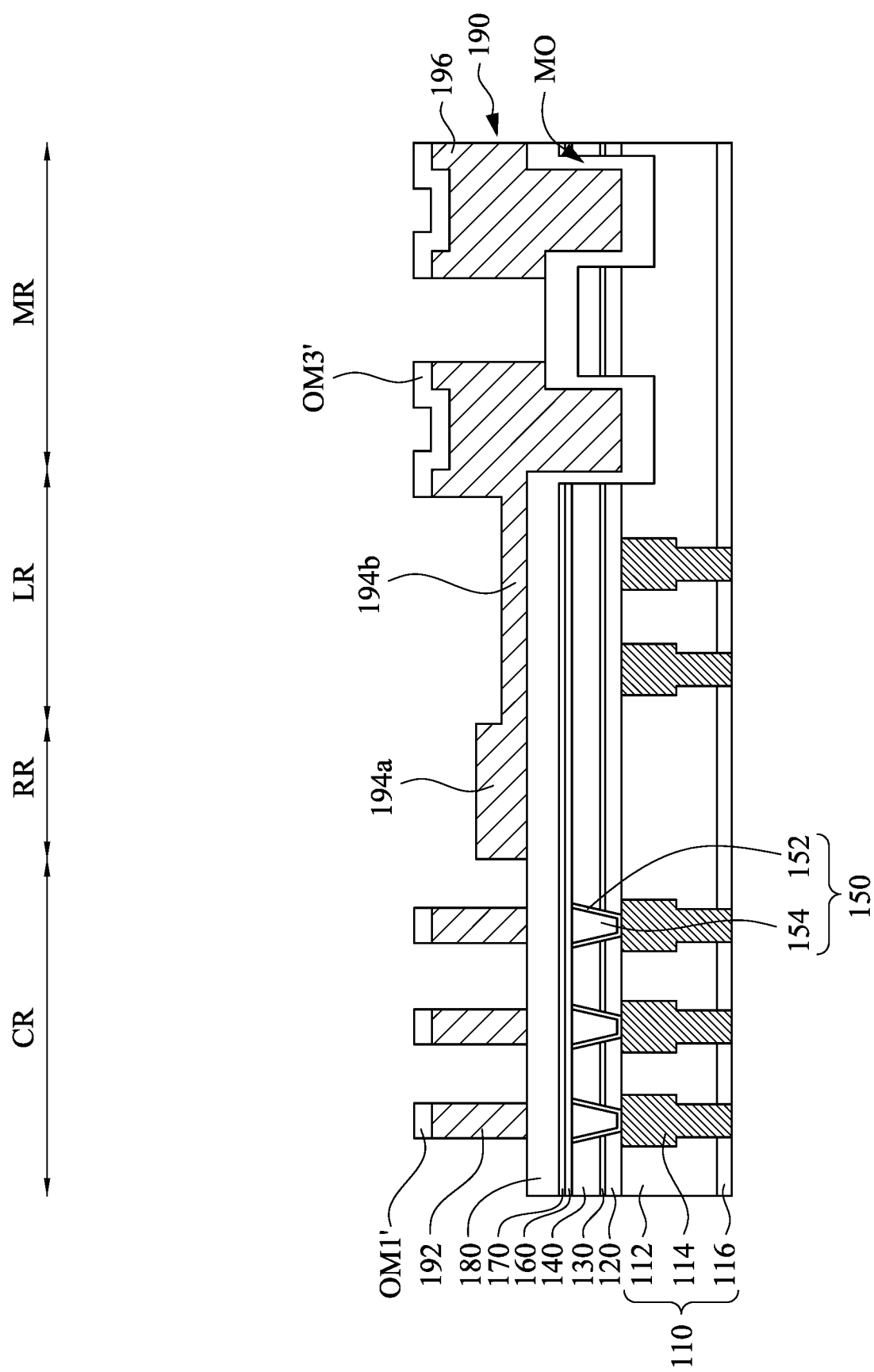

Referring FIG. 7F, the top electrode layer 190 is patterned using the patterned oxide mask layer OM as a mask. In the present embodiments, through the thickness difference between the portions OM2 and OM3' of the patterned oxide mask layer OM (referring to FIG. 7E), when the patterned top electrode layer 190 is etched to form the top electrodes 192 and 196, the patterned top electrode layer 190 has an extending portion 194a in the region RR and an extending portion 194b in the region LR, and the extending portion 194a is thicker than the extending portion 194b.

Figure 7G:
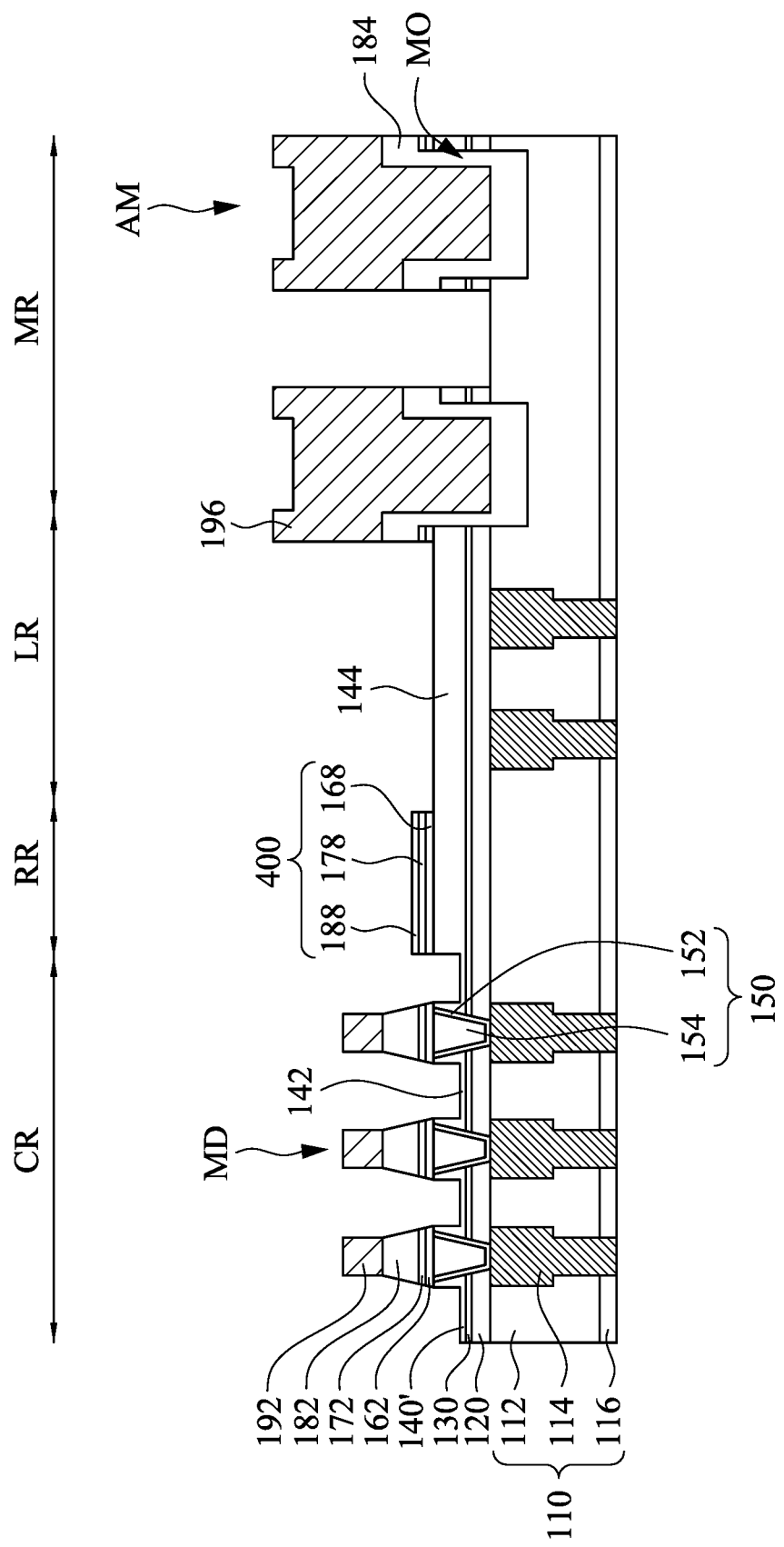

Referring FIG. 7G, the layers 160-180 are patterned through one or more etching processes, and a resistor 400 may be formed during the etching processes. In some embodiments, due to the thickness difference between the extending portions 194a and 194b (referring to FIG. 7F), after the etching process, portions of the layers 160-180 in the region RR remains, and portions of the layers 160-180 in the region LR are removed. For example, the top electrode layer 190 is patterned into top electrodes 192 and 196. The resistance switching layer 180 is patterned into a resistance switching element 182 and a resistor element 188. The buffer layer 170 is patterned into a buffer 172 and a resistor element 178. The bottom electrode layer 160 is patterned into a bottom electrode 162 and a resistor element 168. The resistor 400 includes the resistor elements 168, 178, and 188. Other details of the patterning process are similar to those aforementioned, and not repeated herein.

Figure 7H:
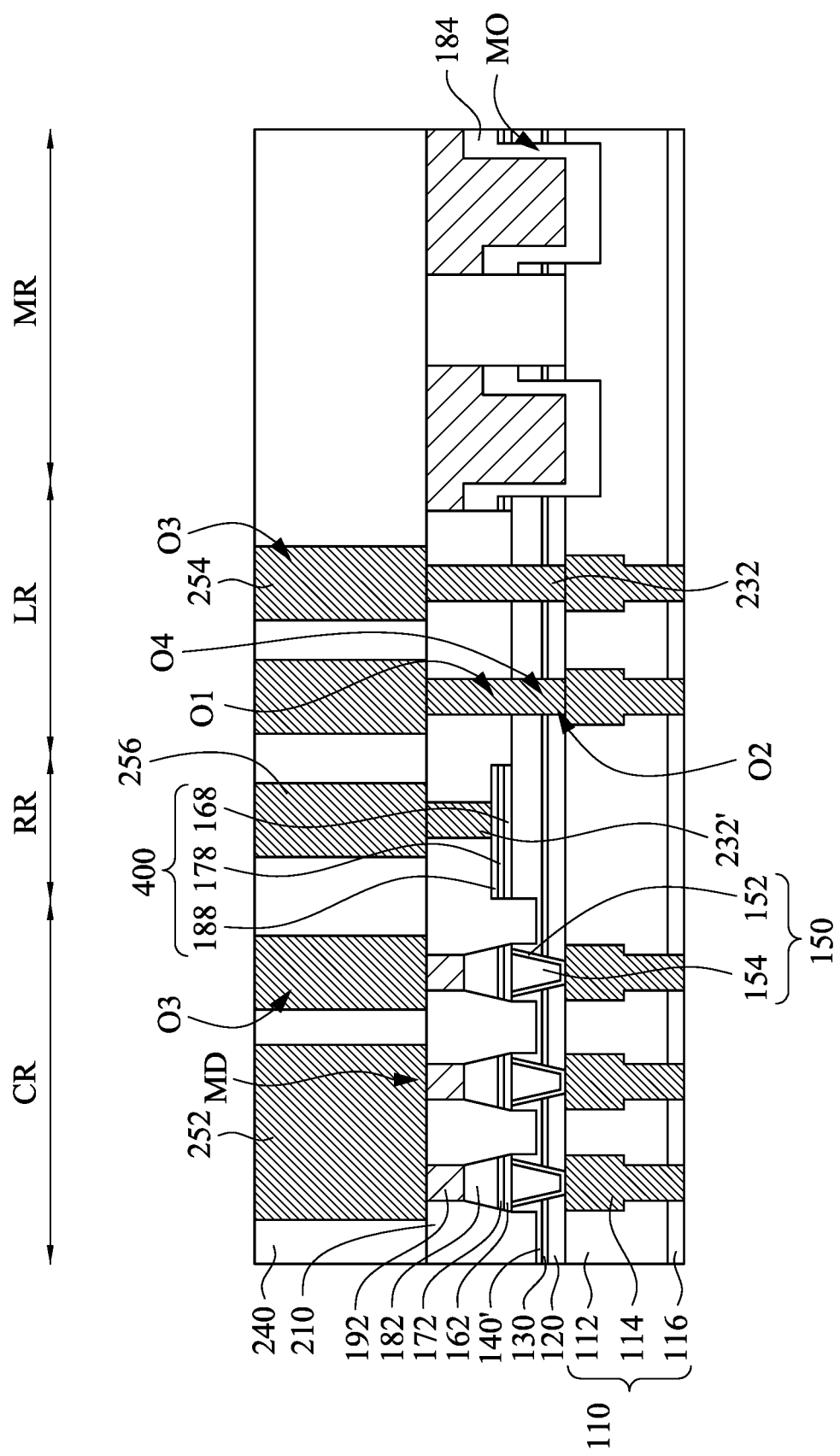

Reference is made to FIG. 7H. An ILD layer 210 is formed over the structure of FIG. 7G, and the metallization pattern 232 and 232' are formed in the ILD layer 210 and connected with the metallization pattern 114 in the logic region LR and the resistor 400 respectively. The metallization pattern 232 and 232' may include plural metal vias. Herein, openings are formed in the etch stop layer 120, the protective layer 130, and the dielectric layer 140, and the metallization pattern 230 is formed in the openings. For example, metallization pattern 230 is formed in the openings O4 are formed in the protective layer 130. Subsequently, an ILD layer 240 is formed thereon, and then metallization patterns 252-256 are formed in the ILD layer 240. The metallization patterns 252 and 254 are connected to memory device MD in the cell region CR and the metallization pattern 230 in the logic region LR respectively. The metallization pattern 256 is connected to the resistor 400 through the metallization pattern 232'. A high-resistance circuit is provided herein. Other details of the present embodiments are similar to those aforementioned and not repeated herein.

Figure 8:
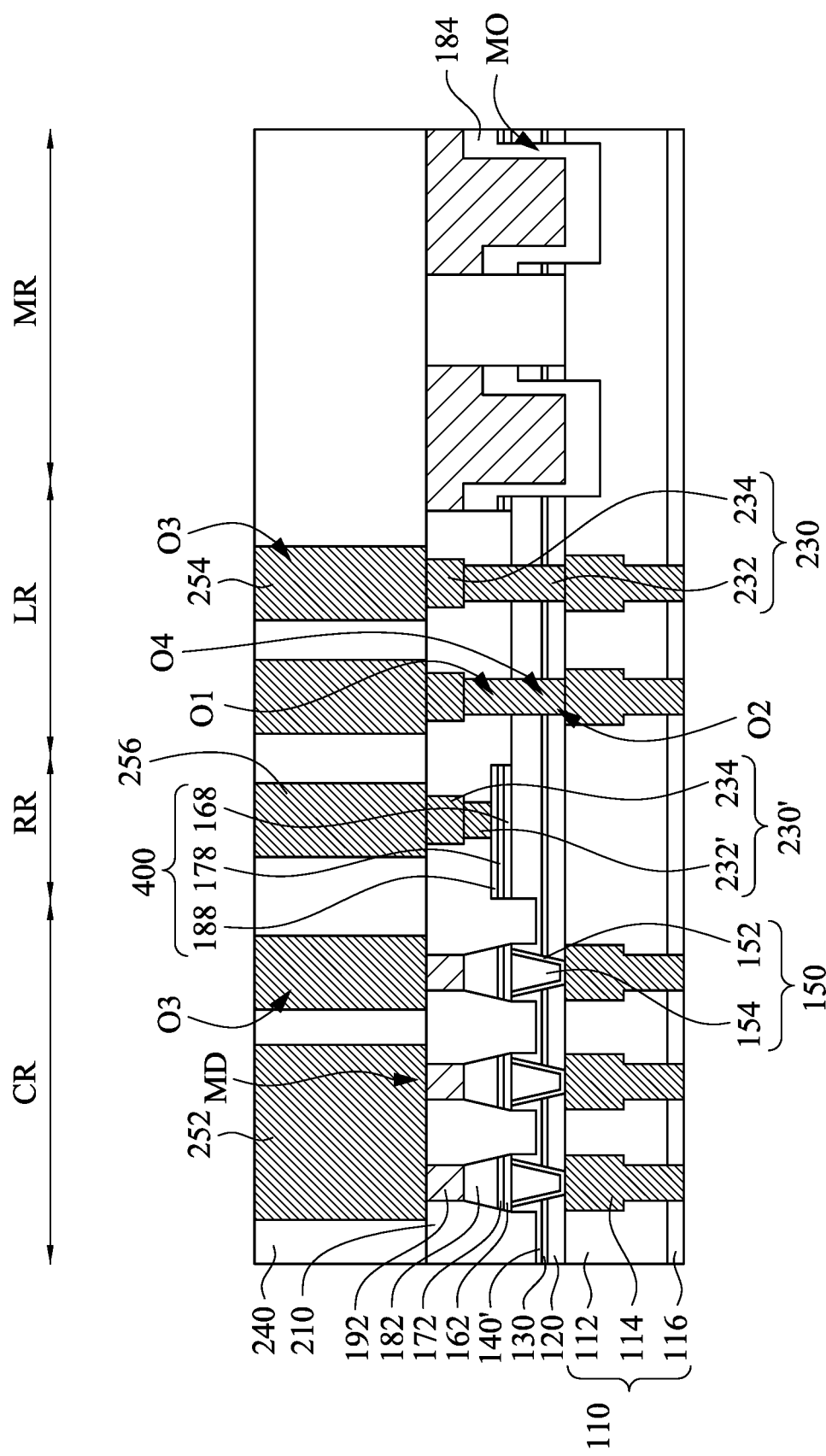
FIG. 8 is a cross-sectional view of an integrated circuit according to various embodiments of the present disclosure.

FIG. 8 is a cross-sectional view of an integrated circuit according to various embodiments of the present disclosure. The present embodiments are similar to those of FIG. 7G, and the difference between the present embodiments and the embodiments of FIG. 7G is that a metallization pattern 230 including metal vias 232 and metal lines 234 and a metallization pattern 230' including metal vias 232' and metal lines 234 is formed in the ILD layer 210 before the formation of the ILD 240 and the metallization patterns 252 and 254. In some examples, a height of the metallization pattern 230 may be equal to a height of the memory device MD. The metallization pattern 230 serves a $M_x$ metal layer, the metallization pattern 114 serves a $M_{x-1}$ metal layer, and the metallization pattern 254 serves a $M_{x+1}$ metal layer.

Figure 9:
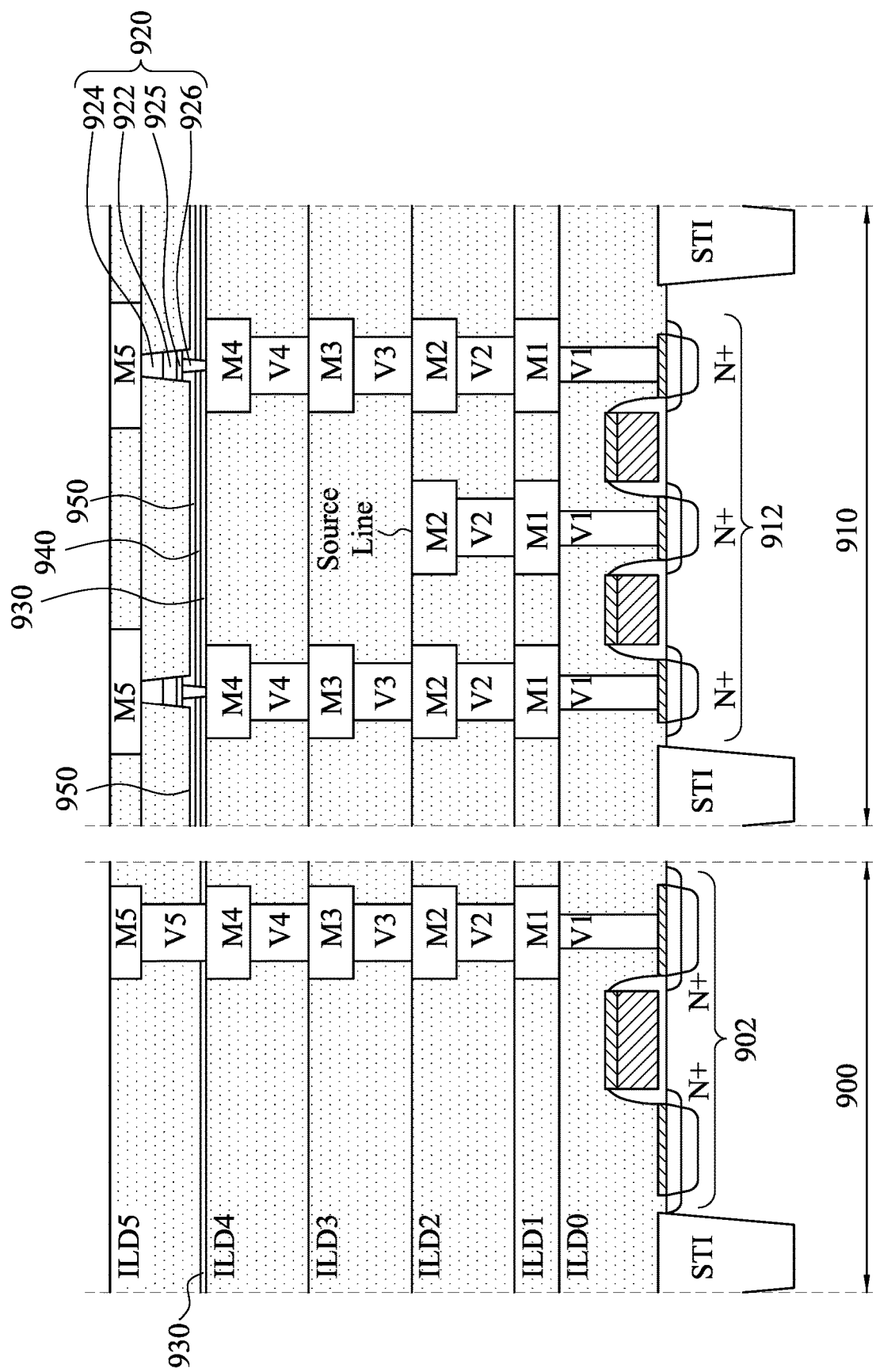
FIG. 9 illustrates an integrated circuit including memory devices and logic devices.

FIG. 9 illustrates an integrated circuit including MRAM devices and logic devices. The integrated circuit includes a logic region 900 and a MRAM region 910. Logic region 900 may include circuitry, such as the exemplary transistor 902, for processing information received from MRAM devices 920 in the MRAM region 910 and for controlling reading and writing functions of MRAM devices 920. In some embodiments, the MRAM device 920 includes a resistance switching element 922, a top electrode 924 over the resistance switching element 922, and a bottom electrode 925 under the resistance switching element 922, and a BEVA 926 under the bottom electrode 925 and in an etch stop layer 930, a protective layer 940, and a dielectric layer 950. The etch stop layer 930 extends across the logic region 900 and the MRAM region 910. The protective layer 940 is in the MRAM region 910 and terminates before reaching the logic region 900. The dielectric layer 950 is in the MRAM region 910 and terminates before reaching the logic region 900.

As depicted, the integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with V1 connecting the stack to a source/drain contact of logic transistor 902. The MRAM region 910 includes a full metallization stack connecting MRAM devices 920 to transistors 912 in the MRAM region 910, and a partial metallization stack connecting a source line to transistors 912 in the MRAM region 910. MRAM devices 920 are depicted as being fabricated in between the top of the M4 layer and the bottom the M5 layer. In some embodiments, MRAM devices 920 may be with the same height of M5+V5, and thus the M5 layer is absent from the MRAM region 910. Also included in integrated circuit is a plurality of ILD layers. Six ILD layers, identified as ILD0 through ILD5 are depicted in FIG. 9 as spanning the logic region 900 and the MRAM region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the dielectric layer in the logic region is thickened by designing plural layers above the dielectric layer with suitable thickness based on an etching selectivity between the top electrodes and the dielectric layer, an etching selectivity between the top electrodes and the oxide mask, and an etching selectivity between the top electrodes and the MTJ stack, such that the dielectric layer may protect the underlying metallization pattern during etching the MTJ stack, and thereby preventing the punching through issue. Another advantage is that the process is low cost since the memory devices are formed with an oxide dielectric layer for protecting logic region. Still another advantage is that a high-resistance circuit is formed with the memory devices, thereby enlarging the application field.

According to some embodiments of the present disclosure, an integrated circuit is provided. The integrated circuit includes a metallization pattern, a dielectric layer, and plural memory devices. The metallization pattern has plural first conductive features and a second conductive feature. The dielectric layer is over the metallization pattern, in which the dielectric layer has a first portion over the first conductive features and a second portion over the second conductive feature. The memory devices are at least partially in the first portion of the dielectric layer and respectively connected with the first conductive features. The first portion of the dielectric layer has a plurality of side parts respectively surrounding the memory devices and an extending part connecting the side parts to each other, and a thickness of the second portion is greater than a thickness of the extending part of the first portion of the dielectric layer.

According to some embodiments of the present disclosure, a device includes a dielectric layer, a memory device, and a resistor. The memory device includes a bottom electrode via, a bottom electrode, a resistance switching element, and a top electrode. The bottom electrode via is in the dielectric layer. The dielectric layer has a first portion extending along sidewalls of the bottom electrode via, a second portion extending laterally from the first portion, and a third portion. The bottom electrode is over the bottom electrode via. The resistance switching element is over the bottom electrode. The top electrode is over the resistance switching element. The resistor is over the third portion of the dielectric layer. A thickness of the third portion of the dielectric layer is greater than a thickness of the second portion of the dielectric layer.

According to some embodiments of the present disclosure, a device includes a first metallization pattern, a first dielectric layer, a first memory device, and a second memory device. The first metallization pattern has a first conductive feature and a second conductive feature. The first dielectric layer is over the first metallization pattern. The first memory device has a first bottom electrode via in the first dielectric layer and over the first conductive feature. The first dielectric layer has a first portion extending along sidewalls of the first bottom electrode via and a second portion extending laterally from the first portion. The second memory device has a second bottom electrode via in the first dielectric layer and over the second conductive feature. The first dielectric layer has a third portion extending along sidewalls of the second bottom electrode via and a fourth portion extending laterally from the third portion. A thickness of the fourth portion of the first dielectric layer is greater than a thickness of the second portion of the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a metallization pattern having a plurality of first conductive features and a second conductive feature;
   a dielectric layer over the metallization pattern, wherein the dielectric layer has a first portion over the first conductive features and a second portion over the second conductive feature; and
   a plurality of memory devices at least partially in the first portion of the dielectric layer and respectively connected with the first conductive features, wherein the first portion of the dielectric layer has a plurality of side parts respectively surrounding the memory devices and an extending part connecting the side parts to each other, and a thickness of the second portion is greater than a thickness of the extending part of the first portion of the dielectric layer.

2. The integrated circuit of claim 1, wherein the thickness of the second portion of the dielectric layer is equal to or less than a thickness of the side parts of the first portion of the dielectric layer.

3. The integrated circuit of claim 1, further comprising:
   a dummy memory device at least partially in the second portion of the dielectric layer.

4. The integrated circuit of claim 1, further comprising:
   a conductive via in the second portion of the dielectric layer and connected with the second conductive feature.

5. A device, comprising:
   a first metallization pattern having a first conductive feature and a second conductive feature;
   a first dielectric layer over the first metallization pattern;
   a first memory device having a first bottom electrode via in the first dielectric layer and over the first conductive feature, wherein the first dielectric layer has a first portion extending along sidewalls of the firs bottom electrode via and a second portion extending laterally from the first portion; and
   a second memory device having a second bottom electrode via in the first dielectric layer and over the second conductive feature, wherein the first dielectric layer has a third portion extending along sidewalls of the second bottom electrode via and a fourth portion extending laterally from the third portion, and a thickness of the fourth portion of the first dielectric layer is greater than a thickness of the second portion of the first dielectric layer.

6. The device of claim 5, wherein a top surface of the fourth portion of the first dielectric layer is higher than a top surface of the second portion of the first dielectric layer.

7. The device of claim 5, wherein the second portion of the first dielectric layer extends laterally from the first portion of the first dielectric layer to the fourth portion of the first dielectric layer.

8. The device of claim 5, further comprising:
   a third memory device having a third bottom electrode via in the first dielectric layer, wherein the first dielectric layer has a fifth portion extending along sidewalls of the third bottom electrode via, and the fourth portion of the first dielectric layer extends laterally from the third portion of the first dielectric layer to the fifth portion of the first dielectric layer.

9. The device of claim 5, wherein the thickness of the second portion of the first dielectric layer is less than a thickness of the first portion of the first dielectric layer.

10. The device of claim 5, wherein the thickness of the fourth portion of the first dielectric layer is less than a thickness of the third portion of the first dielectric layer.

11. The device of claim 5, further comprising:
a second dielectric layer over the first and second memory devices, wherein the second memory device has a top electrode over the second bottom electrode via, and a top surface of the top electrode of the second memory device is in contact with the second dielectric layer.

12. The device of claim 11, further comprising:
a second metallization pattern in the second dielectric layer, wherein the first memory device has a top electrode over the first bottom electrode via, and a top surface of the top electrode of the first memory device is in contact with the second metallization pattern.

13. An integrated circuit, comprising:
a substrate having a cell region and a logic region;
a first metallization pattern having a first conductive feature and a second conductive feature respectively over the cell region and the logic region;
an etch stop layer over the first metallization pattern, wherein the etch stop layer has a first portion and a second portion respectively over the cell region and the logic region;
a metal-containing compound layer over the first portion of the etch stop layer;
a dielectric layer over the metal-containing compound layer;
a memory device having a bottom electrode via, a bottom electrode over the bottom electrode via, a resistance switching element over the bottom electrode, and a top electrode over the resistance switching element, wherein the bottom electrode via extends through the dielectric layer, the metal-containing compound layer, and the etch stop layer to the first conductive feature; and
a third conductive feature extending through the etch stop layer to the second conductive feature.

14. The integrated circuit of claim 13, wherein the second portion of the etch stop layer is free from coverage of the metal-containing compound layer and the dielectric layer.

15. The integrated circuit of claim 13, wherein the dielectric layer comprises:
a first portion extending along a top surface of the metal-containing compound layer, wherein the bottom electrode via extends through the first portion of the dielectric layer; and
a second portion extending along the top surface of the metal-containing compound layer, wherein the second portion of the dielectric layer is between the first portion of the dielectric layer and the logic region, and a thickness of the second portion of the dielectric layer is greater than a thickness of the first portion of the dielectric layer.

16. The integrated circuit of claim 15, wherein the dielectric layer further comprises:
a third portion extending along sidewalls of the bottom electrode via and connected with the first portion of the dielectric layer.

17. The integrated circuit of claim 15, further comprising:
a dummy memory device having a dummy bottom electrode via, wherein the dummy bottom electrode via extends through the second portion of the dielectric layer, the metal-containing compound layer, and the etch stop layer.

18. The integrated circuit of claim 17, wherein the dummy memory device further comprises a dummy bottom electrode over the dummy bottom electrode via, a dummy resistance switching element over the dummy bottom electrode, and a dummy top electrode over the dummy resistance switching element.

19. The integrated circuit of claim 17, further comprising:
a second metallization pattern having a fourth conductive feature and a fifth conductive feature respectively over the cell region and the logic region, wherein the fourth conductive feature is connected with the top electrode of the memory device, the fifth conductive feature is connected with the third conductive feature, and the dummy memory device is disconnected from the second metallization pattern.

20. The integrated circuit of claim 13, wherein the metal-containing compound layer is an aluminum-containing compound layer.

* * * * *